(12) United States Patent
Bunyk

(10) Patent No.: US 9,865,648 B2
(45) Date of Patent: Jan. 9, 2018

(54) SYSTEMS AND METHODS FOR TESTING AND PACKAGING A SUPERCONDUCTING CHIP

(71) Applicant: D-Wave Systems Inc., Burnaby (CA)

(72) Inventor: Paul I. Bunyk, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 718 days.

(21) Appl. No.: 14/109,604

(22) Filed: Dec. 17, 2013

(65) Prior Publication Data

US 2014/0246763 A1    Sep. 4, 2014

Related U.S. Application Data

(60) Provisional application No. 61/738,243, filed on Dec. 17, 2012.

(51) Int. Cl.
*H01L 27/18*    (2006.01)
*H01L 39/04*    (2006.01)
(Continued)

(52) U.S. Cl.
CPC ............ *H01L 27/18* (2013.01); *H01L 24/05* (2013.01); *H01L 24/13* (2013.01); *H01L 39/045* (2013.01); *G01R 31/2884* (2013.01); *G01R 31/2891* (2013.01); *H01L 24/81* (2013.01); *H01L 39/24* (2013.01); *H01L 2224/0401* (2013.01); *H01L 2224/05008* (2013.01); *H01L 2224/05023* (2013.01); *H01L 2224/05179* (2013.01); *H01L 2224/05548* (2013.01); *H01L 2224/05568* (2013.01); *H01L 2224/05573* (2013.01); *H01L 2224/05611* (2013.01); *H01L 2224/136* (2013.01); *H01L 2224/13007* (2013.01);
(Continued)

(58) Field of Classification Search
CPC ...... H01L 2924/14; H01L 27/18; H01L 24/13
USPC ........................................................ 257/661
See application file for complete search history.

(56) References Cited

U.S. PATENT DOCUMENTS 5,440,239 A    8/1995  Zappella et al.
6,678,540 B2 *  1/2004  Wire ...................... H01P 1/047
                                                333/247
(Continued)

OTHER PUBLICATIONS

Amin, "Effect of Local Minima on Adiabatic Quantum Optimization," Physical Review Letters 100:130503-1-130503-4, 2008.
(Continued)

*Primary Examiner* — Marc Armand
(74) *Attorney, Agent, or Firm* — Seed IP Law Group LLP

(57) ABSTRACT

Superconductive interconnection structures providing continuous, uninterrupted superconducting signal paths between a superconducting chip and a superconducting chip carrier are described. The superconductive interconnection structures employ superconducting solder bumps and pillars of Under Bump Metal ("UBM"). The superconductive interconnection structures are employed in a two-stage solder bumping process in which the superconducting chip is first bonded to a testing module for screening and then bonded to a chip packaging module for operation. Either the testing module or the chip packaging module, or both, may include a multi-chip module for carrying multiple superconducting chips simultaneously.

28 Claims, 9 Drawing Sheets

(51) Int. Cl.
  *H01L 23/00* (2006.01)
  *H01L 39/24* (2006.01)
  *G01R 31/28* (2006.01)

(52) U.S. Cl.
  CPC .......... *H01L 2224/1357* (2013.01); *H01L 2224/13111* (2013.01); *H01L 2224/13116* (2013.01); *H01L 2224/13144* (2013.01); *H01L 2224/13147* (2013.01); *H01L 2224/13163* (2013.01); *H01L 2224/13176* (2013.01); *H01L 2224/13183* (2013.01); *H01L 2224/13562* (2013.01); *H01L 2224/13582* (2013.01); *H01L 2224/13611* (2013.01); *H01L 2224/16238* (2013.01); *H01L 2224/81191* (2013.01); *H01L 2224/81192* (2013.01); *H01L 2224/81815* (2013.01); *H01L 2224/97* (2013.01); *H01L 2924/15787* (2013.01); *H01L 2924/35121* (2013.01)

(56) References Cited

U.S. PATENT DOCUMENTS

| | | | |
|---|---|---|---|
| 7,135,701 B2 | 11/2006 | Amin et al. | |
| 7,148,483 B1 | 12/2006 | Testardi | |
| 7,533,068 B2 | 5/2009 | Maassen van den Brink et al. | |
| 7,932,515 B2 | 4/2011 | Bunyk | |
| 8,008,942 B2 | 8/2011 | van den Brink et al. | |
| 8,018,244 B2 | 9/2011 | Berkley | |
| 8,190,548 B2 | 5/2012 | Choi | |
| 8,195,596 B2 | 6/2012 | Rose et al. | |
| 2006/0147154 A1 | 7/2006 | Thom et al. | |
| 2006/0225165 A1 | 10/2006 | Maassen van den Brink et al. | |
| 2008/0176750 A1 | 7/2008 | Rose et al. | |
| 2008/0238531 A1 | 10/2008 | Harris | |
| 2009/0173936 A1* | 7/2009 | Bunyk | B82Y 10/00 257/31 |
| 2010/0052024 A1* | 3/2010 | Kiyomura | H01G 4/08 257/296 |
| 2010/0148853 A1 | 6/2010 | Harris et al. | |
| 2011/0022820 A1 | 1/2011 | Bunyk et al. | |
| 2012/0007230 A1* | 1/2012 | Hwang | H01L 24/03 257/737 |
| 2012/0068334 A1* | 3/2012 | Migita | H01L 24/11 257/737 |

OTHER PUBLICATIONS

Ogashiwa et al., "Flip-Chip Bonding Using Superconducting Solder Bump," Japanese Journal of Applied Physics, 34:4043-4046, Part 1, No. 8A, Aug. 1995.

* cited by examiner

SYSTEMS AND METHODS FOR TESTING AND PACKAGING A SUPERCONDUCTING CHIP

BACKGROUND

Field

This disclosure generally relates to superconducting integrated circuits and particularly relates to testing and packaging superconducting integrated circuit chips.

Superconducting Processor

A superconducting integrated circuit may take the form of a superconducting processor, where the superconducting processor may be a classical processor or a quantum processor. A superconducting quantum processor may make use of quantum effects such as quantum tunneling, superposition, and/or entanglement whereas a superconducting classical processor may not make use of these effects, but may rather operate by emphasizing different principles, such as for example the principles that govern the operation of semiconducting classical processors. However, there may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present systems and methods are particularly well-suited for use with both superconducting quantum processors and superconducting classical processors.

Quantum Processor

A quantum processor may take the form of a superconducting quantum processor. A superconducting quantum processor may include a number of physical qubits and associated local bias devices, for instance two or more superconducting qubits. A superconducting quantum processor may also employ coupling devices (i.e., "couplers") providing communicative coupling between qubits. Further details and embodiments of exemplary quantum processors that may be used in conjunction with the present systems and devices are described in, for example but not limited to, U.S. Pat. No. 7,533,068, U.S. Pat. No. 8,008,942, U.S. Pat. No. 8,195,596, U.S. Pat. No. 8,190,548, and US Patent Publication 2011-0022820.

Integrated Circuit Fabrication and Packaging

Traditionally, the fabrication and packaging of superconducting integrated circuits has not been performed at state-of-the-art semiconductor fabrication facilities. This may be due to the fact that some of the materials used in superconducting integrated circuits can contaminate the semiconductor facilities. For instance, gold may be used as a resistor in superconducting circuits, but gold can contaminate a fabrication tool used to produce CMOS wafers in a semiconductor facility. Consequently, superconducting integrated circuits containing gold are typically not processed by tools which also process CMOS wafers.

Superconductor fabrication and packaging has typically been performed in research environments where standard industry practices could be tailored for superconducting circuit production. Due to issues associated with superconducting circuits, not all semiconductor processes and techniques are necessarily transferrable to superconductor chip production. Transforming semiconductor processes and techniques for use in superconductor chip and circuit fabrication often requires changes and fine adjustments. Such changes and adjustments typically are not obvious and may require a great deal of experimentation. The semiconductor industry faces problems and issues not necessarily related to the superconducting industry. Likewise, problems and issues that concern the superconducting industry are often of little or no concern in standard semiconductor fabrication.

Solder Bump Bonding

A solder bump is a small sphere/hemisphere of solder that is used for establishing a "bond" (i.e., an electrical connection) between two electrical current paths (e.g., between an electrical device and a bonding pad/contact area). Solder bump bonding is a widely used technique in the semiconductor industry but is considerably less developed in the superconductor industry. Two important challenges in the superconductor industry are: establishing continuous, uninterrupted superconductive electrical connections through solder bumps and providing solder bumps of uniform height to prevent the formation of opens or shorts. In the semiconductor industry, uniform solder bump height is achieved by fabricating a pillar/thick layer of Under Bump Metal (UBM) on the chip/carrier device prior to forming each solder bump. Copper, gold and nickel are among the popular materials used for UBM due to their conductivity at room temperature and their ability to provide structural support to the corresponding solder bumps. However, neither gold nor copper are superconducting metals. Non-superconducting materials such as gold and copper are undesirable in superconducting chip bonding as such materials will exhibit resistivity at cryogenic temperatures which produces heat that may hinder effective signal transmission and/or circuit performance. Furthermore, non-superconducting metals such as gold or copper can interrupt a continuous superconducting current path due to their electrical resistance.

In T. Ogashiwa et al., T. Ogashiwa et al., 1995, *"Flip-Chip Bonding Using Superconducting Solder Bump,"* Japanese Journal of Applied Physics, Vol. 34, 1995, pp. 4043-4046, a superconducting chip is bonded to a ceramic substrate using superconducting solder bumps. Wirings of copper lines are coated with a superconducting solder, such as an 80/20 mixture of Pb/Sn, and there are no pillars of UBM that provide structural support to the solder bumps which could result in non-uniform solder bump heights producing unintentional shorts, floating signals, and so forth.

In U.S. Pat. No. 5,440,239, a transferrable solder bump technique is introduced for assembly of semiconductor Multi Chip Module (MCM) substrates. A semiconductor die/chip employing normal metal conductors (e.g., copper, gold, etc.) is first attached to a test board using transferable solder bumps. Coupling between the solder bumps and the test board is mediated by a chrome oxide layer such that, when the chip is subsequently detached from the test board, the solder bumps transfer to the chip (i.e., separate from the chrome oxide layer) and are re-usable for future chip bonding. Such a technique may be suited well for semiconductor fabrication, but cannot be used in the superconductor industry due to some of the materials used being non-superconducting. There is also no mechanism for ensuring uniform solder bump height; thus, U.S. Pat. No. 5,440,239 does not teach superconductive electrical connections and does not teach uniform solder bump heights.

Clearly, these techniques for flip-chip bonding and interconnection and assembly of chips using transferable solder bumps are not ideal for testing and packaging a superconducting chip.

BRIEF SUMMARY

There is a need in the art for techniques and suitable materials for testing and packaging a superconducting chip such that a continuous/uninterrupted superconducting path is achieved through the interconnects comprising solder bumps of uniform height and that a superconducting chip can be easily, quickly and advantageously attached to and detached from a corresponding testing or a chip packaging module. A method of testing and packaging a superconducting chip, wherein the superconducting chip includes at least one material that superconducts below a critical temperature, may be summarized as including forming a first set of superconducting solder bumps on the superconducting chip; superconductively electrically coupling the superconducting chip to a testing module via the first set of superconducting solder bumps to form a testing assembly; cooling the testing assembly to a first temperature below the critical temperature such that the superconducting chip superconducts; testing electrical properties of the superconducting chip while the superconducting chip superconducts; removing the superconducting chip from the testing assembly, wherein removing the superconducting chip from the testing assembly includes decoupling the superconducting chip from the testing module via the first set of superconducting solder bumps; forming a second set of superconducting solder bumps on a chip packaging module; and superconductively electrically coupling the superconducting chip to the chip packaging module via the second set of superconducting solder bumps. The testing module may include a first set of superconducting bonding pads, each superconducting bonding pad in the first set of superconducting bonding pads including at least one layer of superconducting material, and superconductively electrically coupling the superconducting chip to the testing module via the first set of superconducting solder bumps may include superconductively electrically coupling the superconducting chip to the first set of superconducting bonding pads via the first set of superconducting solder bumps. Superconductively electrically coupling the superconducting chip to the testing module via the first set of superconducting solder bumps may include positioning the superconducting chip in physical contact with the testing module such that each superconducting solder bump in the first set of superconducting solder bumps aligns with and forms a superconductive electrical connection to a respective superconducting bonding pad in the first set of superconducting bonding pads. The superconducting chip may include a second set of superconducting bonding pads, each superconducting bonding pad in the second set of superconducting bonding pads including at least one layer of superconducting material, and superconductively electrically coupling the superconducting chip to the chip packaging module via the second set of superconducting solder bumps may include superconductively electrically coupling the superconducting chip to the second set of superconducting bonding pads via the second set of superconducting solder bumps. Superconductively electrically coupling the superconducting chip to the chip packaging module via the second set of superconducting solder bumps may include positioning the superconducting chip in physical contact with the chip packaging module such that each superconducting solder bump in the second set of superconducting solder bumps aligns with and forms a superconductive electrical connection to a respective superconducting bonding pad in the second set of superconducting bonding pads. The superconducting chip may include a superconducting quantum processor. The testing module may include a multi-chip module. Superconductively electrically coupling the superconducting chip to the testing module via the first set of superconducting solder bumps may include superconductively electrically coupling the superconducting chip to the testing module via a solder reflow process. Superconductively electrically coupling the superconducting chip to the chip packaging module via the second set of superconducting solder bumps may include superconductively electrically coupling the superconducting chip to the chip packaging module via a solder reflow process. The method may further include cooling the chip packaging module to a second temperature below the critical temperature such that the superconducting chip superconducts. The second temperature may be lower than the first temperature. Superconductively electrically coupling the superconducting chip to the testing module via the first set of superconducting solder bumps may include forming a first set of continuous, uninterrupted superconducting signal paths between the superconducting chip and the testing module; and superconductively electrically coupling the superconducting chip to the chip packaging module via the second set of superconducting solder bumps may include forming a second set of continuous, uninterrupted superconducting signal paths between the superconducting chip and the chip packaging module.

A method of testing and packaging a superconducting chip, wherein the superconducting chip includes at least one material that superconducts below a critical temperature, may be summarized as including forming a first set of superconducting solder bumps on a testing module; superconductively electrically coupling the superconducting chip to the testing module via the first set of superconducting solder bumps to form a testing assembly; cooling the testing assembly to a first temperature below the critical temperature such that the superconducting chip superconducts; testing electrical properties of the superconducting chip while the superconducting chip superconducts; removing the superconducting chip from the testing assembly, wherein removing the superconducting chip from the testing assembly includes decoupling the superconducting chip from the testing module via the first set of superconducting solder bumps; forming a second set of superconducting solder bumps on a chip packaging module; and superconductively electrically coupling the superconducting chip to the chip packaging module via the second set of superconducting solder bumps. The superconducting chip may include a first set of superconducting bonding pads, each superconducting bonding pad in the first set of superconducting bonding pads including at least one layer of superconducting material, and superconductively electrically coupling the superconducting chip to the testing module via the first set of superconducting solder bumps may include superconductively electrically coupling the testing module to the first set of superconducting bonding pads via the first set of superconducting solder bumps. Superconductively electrically coupling the superconducting chip to the testing module via the first set of superconducting solder bumps may include positioning the superconducting chip in physical contact with the testing module such that each superconducting solder bump in the first set of superconducting solder bumps aligns with and forms a superconductive electrical connection to a respective superconducting bonding pad in the first set of superconducting bonding pads. Superconductively electrically coupling the superconducting chip to the chip packaging module via the second set of superconducting solder bumps may include superconductively electrically coupling the chip packaging module to the first set of superconducting bonding pads via the second set of superconducting solder bumps. Superconductively electrically coupling the superconducting chip to the chip packaging module via the second set of superconducting solder bumps may include positioning the superconducting chip in physical contact with the chip packaging module such that each superconducting solder bump in the second set of superconducting solder bumps aligns with and forms a superconductive electrical connection to a respective superconducting bonding pad in the first set of superconducting bonding pads. The superconducting chip may include a superconducting quantum processor. The testing module may include a multi-chip module. Superconductively electrically coupling the superconducting chip to the testing module via the first set of superconducting solder bumps may include superconductively electrically coupling the superconducting chip to the testing module via a solder reflow process. Superconductively electrically coupling the superconducting chip to the chip packaging module via the second set of superconducting solder bumps may include superconductively electrically coupling the superconducting chip to the chip packaging module via a solder reflow process. The method may further include cooling the chip packaging module to a second temperature below the critical temperature such that the superconducting chip superconducts. The second temperature may be lower than the first temperature. Superconductively electrically coupling the superconducting chip to the testing module via the first set of superconducting solder bumps may include forming a first set of continuous, uninterrupted superconducting signal paths between the superconducting chip and the testing module; and superconductively electrically coupling the superconducting chip to the chip packaging module via the second set of superconducting solder bumps may include forming a second set of continuous, uninterrupted superconducting signal paths between the superconducting chip and the chip packaging module.

A superconductive interconnection structure may be summarized as including a superconductive bonding pad; a pillar of under-bump metal ("UBM") formed on at least a portion of the superconductive bonding pad; and a bump of superconductive solder formed on the pillar of UBM. The pillar of UBM may be superconductive. The pillar of UBM may include at least one material selected from the group consisting of: osmium, rhenium, ruthenium and a combination thereof. The superconductive interconnection structure may further include a layer of superconductive material deposited over the pillar of UBM and the superconductive bonding pad such that the layer of superconductive material is interposed between the pillar of UBM and the bump of superconductive solder. The layer of superconductive material may include tin. The pillar of UBM may include at least one material selected from the group consisting of: copper and gold.

A method of forming a superconductive interconnection structure may be summarized as including depositing a superconductive bonding pad; depositing a pillar of under-bump metal ("UBM") on at least a portion of the superconductive bonding pad; and depositing a bump of superconductive solder on the pillar of UBM. Depositing a pillar of UBM on at least a portion of the superconductive bonding pad may include depositing a pillar of superconductive UBM on at least a portion of the superconductive bonding pad. Depositing a pillar of superconductive UBM may include depositing a pillar of at least one superconductive material selected from the group consisting of: osmium, rhenium, ruthenium, and a combination thereof. The method may further include depositing a layer of superconductive material over the pillar of UBM and the superconductive bonding pad such that the layer of superconductive material is interposed between the pillar of UBM and the bump of superconductive solder. Depositing a layer of superconductive material over the pillar of UBM and the superconductive bonding pad may include depositing a layer of tin over the pillar of UBM and the superconductive bonding pad. Depositing a pillar of UBM may include depositing a pillar of at least one material selected from the group consisting of: copper and gold.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

Figure 1:
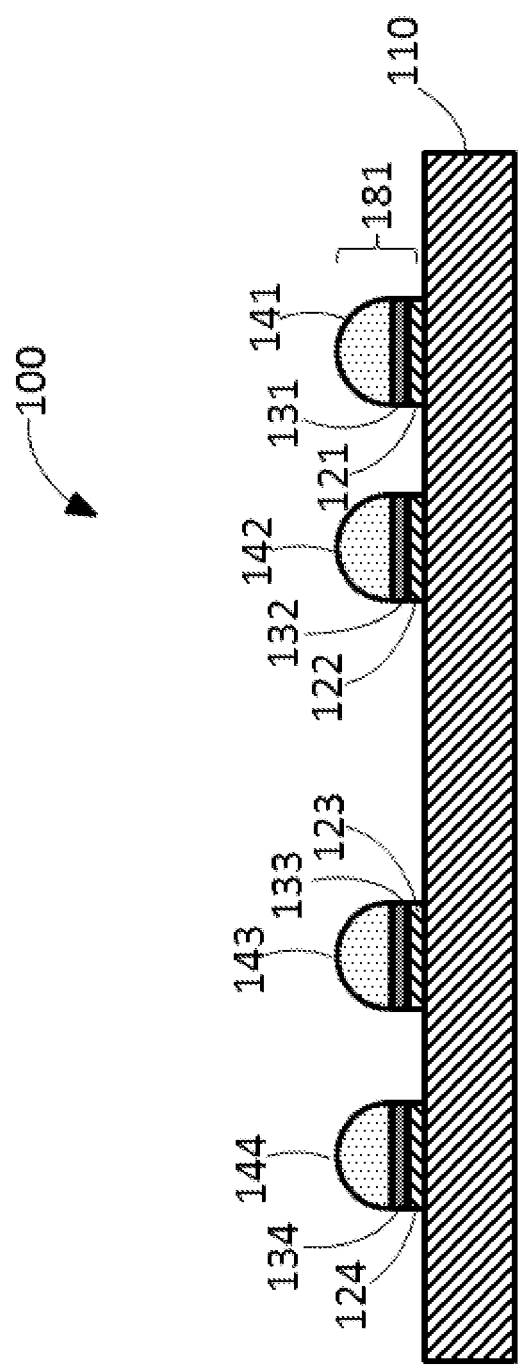
FIG. 1 is sectional view of a superconducting chip with a first set of superconducting solder bumps in accordance with the present systems and methods.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with superconducting processors, such as superconducting devices (e.g., qubits), coupling devices, and control systems including microprocessors and drive circuitry have not been shown or described in detail to avoid unnecessarily obscuring descriptions of the embodiments of the present systems and methods.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a problem-solving system including "a solder bump" includes a single solder bump, or two or more solder bumps. It should also be noted that the term "or" is generally employed in its sense including "and/or" unless the content clearly dictates otherwise.

The headings provided herein are for convenience only and do not interpret the scope or meaning of the embodiments.

For quantum computers to be scalable, coupling of qubits over more than one substrate may be required. Chip substrates of approximately 2 cm×2 cm may hold a finite number of qubits. If more than the available number of qubits are required to encode a problem, multiple chip substrates may be placed in close proximity to each other to facilitate the coupling of qubits carried by the multiple chip substrates. When two qubits from different respective chip substrates are coupled together, quantum information may pass from each coupled qubit, despite being carried by two different chip substrates, as described in U.S. Pat. No. 7,932,515.

Interconnected processor topologies have been described in, e.g., U.S. Pat. No. 7,533,068, U.S. Pat. No. 8,018,244, and U.S. Pat. No. 8,190,548. Each of the interconnected processor topologies allows for scalability of an interconnected topology upon one chip substrate. If a finite number of qubits can be carried by one substrate, for a quantum processor to incorporate more qubits, multiple chip substrates may be coupled together. While it may be possible to employ larger chip substrates, the probability of defect may increase as a function of the number of individual qubits (and/or the size of the chip substrate) increases. A single defect may, in some situations, render the entire chip substrate or a portion of the entire chip defective. Thus, testing candidate chips prior to assembling the chips in production/packaging modules is needed, especially when the use of multiple chip substrates of a relatively smaller size is preferred over the use of a single, larger chip substrate. In order to fully characterize a superconducting chip, the chip must be tested at a cryogenic temperature. Testing a superconducting chip at cryogenic temperature involves mounting the chip in a testing module providing electrical communication to a testing apparatus. It follows that if a chip is to be tested before being assembled into a production/packaging module (e.g., into a multi-chip module), the chip must be assembled into a testing module.

Ensuring superconductivity through interconnects (i.e., electrical connections between a chip and its corresponding module or input/output circuitry) allows for superconducting paths with high enough critical current for superconducting signals to flow through. For example, for quantum processors designed to operate at milliKelvin temperatures, available thermal budget precludes one from having much $I^2R$ (i.e., power) dissipation in signal paths where "I" is the current and "R" is resistance.

For the superconductor industry, materials that exhibit superconductivity at very low temperatures should be used to ensure effective superconducting signal transfer through the chip interconnects. The various embodiments described herein provide systems and methods for testing and packaging a superconducting chip in such a way as to enable superconducting signal transfer between the superconducting chip and the electrical input/output system.

For example, the present systems and methods include a testing module that holds a superconducting chip under test. A testing module comprises a sample holder designed to carry a given superconducting chip. The testing module may be used for holding a superconducting chip while testing the electrical properties of the superconducting chip in a cryogenic environment. Unlike in, for example, U.S. Pat. No. 5,440,239, the interconnections formed between the testing module and the superconducting chip of the present systems and methods provide continuous and/or uninterrupted superconducting signal paths between the testing module and the superconducting chip. Continuous/uninterrupted superconducting signal paths provide minimal resistance and other forms of noise so that the electrical properties of the superconducting chip may be accurately tested. A given testing module may be discarded once the electrical properties of a superconducting chip that is attached to the testing module is complete, or it may be re-used to subsequently test a second chip. Therefore, a testing module may be a single-use module or a multi-use module. A testing module may be capable of holding one superconducting chip or a plurality of superconducting chips. Therefore, a testing module may be a single-chip module or a multi-chip module. Following electrical property testing of a superconducting chip, given the superconducting chip has passed the tests and is considered a "functional/good chip", the superconducting chip may be detached from its testing module and attached to a final assembly module called a "chip packaging module". A chip packaging module may also comprise a sample holder designed to carry a given functional superconducting chip. A chip packaging module may be capable of holding one or more than one superconducting chip. Therefore, a chip packaging module may be a single-chip module or a multi-chip module. A chip packaging module carrying at least one superconducting chip may be integrated into a computing system such as a quantum computing system.

Continuous, uninterrupted superconducting signal paths between a testing module or a chip packaging module and a superconducting chip may be established by physically and superconductively electrically coupling (i.e., via superconductive solder bump bonding) the superconducting chip to the testing module/chip packaging module at each respective region of a superconducting bonding pad formed on the superconducting chip and/or the testing module/chip packaging module. A superconducting bonding pad may comprise a superconducting trace or a superconducting trace and at least one intermediary layer of superconducting material formed on the superconducting trace such as a superconducting "adhesion layer" (if exists) to provide adhesion between the superconducting trace and a respective solder bump. Therefore, depending on the structure and composition, a given superconducting bonding pad may comprise only a superconducting trace or a superconducting trace and at least one intermediary layer of superconducting material formed on the superconducting trace.

Depending on the requirements, at least two types of tests can be performed on a superconducting chip: a quick pre-test, or a comprehensive test. A quick pre-test can be used to test the electrical properties of a superconducting chip such as resistance, capacitance, inductance, magnetic flux, etc. so that a given chip under test may be classified as a functional/good chip or a defective chip. A functional/good chip that passes the quick pre-test may be kept for final assembly while a defective chip may be discarded. A quick pre-test may be carried out in a cryogenic environment with a temperature at or below the lowest critical temperature of the superconducting materials in a testing assembly (i.e., typically in the range of 1K to 10K). The temperature range of 1K to 10K may be reached using relatively quick cooling methods, such as by dipping the testing assembly in a bath of liquid cryogen (e.g., liquid helium) or by using a cryocooler. A comprehensive test can be used to test the behavior/performance properties of the components of a superconducting chip (i.e., qubits, coupling devices) such as persistent current, macroscopic resonant tunneling, etc. A chip that passes a quick pre-test may still fail a comprehensive test. A comprehensive test becomes important when attaching multiple superconducting chips to a single chip packaging module as otherwise a defective chip could hinder the performance of the entire multi-chip processor. A superconducting chip under a comprehensive test may be cooled to a colder cryogenic temperature than a chip under a quick pre-test. For example, a chip under a comprehensive test may be cooled to a milliKelvinmilliKelvin temperature (e.g., on the order of 100 mK, or in the range of about 10 mK-100 mK) so that thermal noise is significantly reduced. The milliKelvin temperature range may be reached using more sophisticated cooling methods, such as a dilution refrigerator; however, cooling a chip to the milliKelvin temperature range is typically a long (e.g., on the order of days) process so it is desirable to ensure that a chip undergoing a comprehensive test has a good likelihood of passing the test (e.g., it has already passed a quick pre-test). Such a test cannot be performed in, for example, U.S. Pat. No. 5,440,239, as a semiconducting chip is used and therefore the chip interconnects are not entirely superconducting and do not provide continuous (i.e., uninterrupted) superconducting current paths between the chip and its input/output circuitry. The non-superconducting materials comprised in the interconnects may act as resistors which dissipate power in the vicinity of the chip and couple thermal noise to the chip components. The present systems and methods present a technique of testing as well as packaging a superconducting chip comprising uninterrupted superconducting chip interconnects so that a superconducting chip may be accurately tested by superconducting signals transferred via the interconnects with minimal interference.

In accordance with some embodiments of the present systems and methods, a quantum processor may be designed to perform adiabatic quantum computation and/or quantum annealing. As previously discussed, a typical adiabatic evolution may be represented by equation 1:

$$H_e = (1-s)H_{In} + sH_f \tag{1}$$

where $H_{In}$ is the initial Hamiltonian, $H_f$ is the final or "problem" Hamiltonian, $H_e$ is the evolution or instantaneous Hamiltonian, and s is the evolution coefficient which controls the rate of evolution. In general, s may vary from 0 to 1 with time t as s(t). A common approach to adiabatic quantum computation ("AQC"), described, for example, in Amin, M. H. S., "Effect of local minima on quantum adiabatic optimization", PRL 100, 130503 (2008), is to start with an initial Hamiltonian of the form shown in equation 2:

$$H_{In} = -\frac{1}{2}\sum_{i=1}^{N}\Delta_i \sigma_i^x \tag{2}$$

where N represents the number of qubits, $\sigma_i^N$ is the Pauli x-matrix for the $i^{th}$ qubit and A is the single qubit tunnel splitting induced in the $i^{th}$ qubit. Here, the $\sigma_i^x$ terms are examples of "off-diagonal" terms. An initial Hamiltonian of this form may, for example, be evolved to a final Hamiltonian of the form:

$$H_f = -\frac{\varepsilon}{2}\left[\sum_{i=1}^{N}h_i\sigma_i^z + \sum_{i,j=1}^{N}J_{ij}\sigma_i^z\sigma_j^z\right] \tag{3}$$

where N represents the number of qubits, $\sigma_i^z$ is the Pauli z-matrix for the $i^{th}$ qubit, $h_i$ and $J_{i,j}$ are dimensionless local fields coupled into each qubit, and E is some characteristic energy scale for $H_f$. Here, the $\sigma_i^z$ and $\sigma_i^z\sigma_j^z$ terms are examples of "diagonal" terms. Throughout this specification, the terms "final Hamiltonian" and "problem Hamiltonian" are used interchangeably. Hamiltonians such as $H_{In}$ and $H_f$ in equations 2 and 3, respectively, may be physically realized in a variety of different ways. A particular example is realized by an implementation of superconducting qubits.

FIG. 1 shows a sectional view of a superconducting device 100 with a first set of superconducting solder bumps 141, 142, 143, and 144 in accordance with the present systems and methods. Superconducting device 100 could be a superconducting chip, a superconducting integrated circuit or a module for connecting to a superconducting chip. Superconducting traces 121, 122, 123, 124 are deposited over substrate 110 of superconducting chip 100. Superconducting layers 131, 132, 133, 134 are deposited over respective superconducting traces 121, 122, 123, 124 and superconducting solder bumps 141, 142, 143, 144 are deposited over respective superconducting layers 131, 132, 133 and 134. Substrate 110 of superconducting chip 100 may comprise a dielectric material such as silicon dioxide. Superconducting traces 121, 122, 123, 124 may comprise a superconducting material such as niobium. Niobium is often used due to its scalability, ability to produce high quality Josephson junctions and high critical temperature (approximately 9.2K), but niobium does not adhere well to most forms of superconducting solder. From hereon it is assumed that superconducting traces comprise niobium or any other superconducting material that may not adhere well to solder. Superconducting solder bumps 141, 142, 143, 144 may comprise a superconducting material such as lead, tin or a combination thereof. Solder bumps (for example, solder bumps 141, 142, 143, 144) comprising superconducting materials such as lead, tin, etc. do not adhere well to most superconducting traces, in particular, niobium traces (for example, superconducting traces 121, 122, 123, 124). Therefore, in accordance with the present systems and methods, superconducting layers 131, 132, 133, 134 comprising a soft superconducting metal such as tin may be formed on niobium traces 121, 122, 123, 124 to provide improved adhesion to superconducting solder bumps 141, 142, 143, 144 without interrupting the superconductivity of the electrical signal paths. Superconducting layers 131, 132, 133, 134 may also be called "intermediary adhesion layers" (hereinafter, adhesion layers 131, 132, 133, 134). Superconducting traces 121, 122, 123, 124 and respective adhesion layers 131, 132, 133, 134 may be referred to as "bonding pads" where the region of a bonding pad on superconducting chip 100 denotes an approximate site for an electrical connection between superconducting chip 100 and a module (for example, a testing module or a chip packaging module). Superconducting traces 121, 122, 123, 124, adhesion layers 131, 132, 133, 134 formed on respective superconducting traces 121, 122, 123, 124, and superconducting solder bumps 141, 142, 143, 144 formed on respective adhesion layers 131, 132, 133, 134 collectively form superconducting interconnection structures (hereinafter, "interconnection structures") each of which forms a portion of a superconducting signal path between superconducting chip 100 and a module such as a testing module or a chip packaging module to which superconducting chip 100 may be superconductively electrically connected. Only interconnection structure 181 comprising superconducting trace 121, adhesion layer 131 and superconducting solder bump 141 is called out in FIG. 1 to reduce clutter. Unlike in U.S. Pat. No. 5,440,239, all of superconducting traces 121, 122, 123, 124, respective adhesion layers 131, 132, 133, 134 and respective superconducting solder bumps 141, 142, 143, 144 comprise superconducting materials so that each interconnection structure (e.g., interconnection structure 181) of superconducting chip 100 provides a continuous, uninterrupted superconducting signal path. A superconducting chip may comprise at least one interconnection structure, and may employ tens, hundreds, or even thousands of interconnection structures. A person of skill in the art will appreciate that while only four interconnection structures are shown in FIG. 1, this number is arbitrary and a superconducting chip may include more or fewer than four interconnection structures.

It is important to ensure that the superconducting solder bumps fabricated on a superconducting chip (for example, superconducting solder bumps 141, 142, 143, 144 of superconducting chip 100) are all approximately uniform in height such that there may be no unintentional interconnections between the superconducting chip and a module (for example, a testing module or a chip packaging module) and no interconnection structures may be floating due to some superconducting solder bumps being too tall/short compared to others. Due to fabrication imperfections and human error, the height of each superconducting solder bump 141, 142, 143, 144 depicted in FIG. 1 may not always be equal. To facilitate uniformity of superconducting solder bump height, a thick layer of Under Bump Metal (hereinafter "UBM") may be deposited on each of the bonding pads on the superconducting chip. The thick layer of UBM may be deposited as a respective pillar on each bonding pad. The thickness/height of UBM controls the spread of solder and therefore the height of each superconducting solder bump. In other words, the thicker the UBM, the larger the height of the corresponding superconducting solder bump and the thinner the UBM, the lower the height of the corresponding superconducting solder bump. A layer of superconducting material serving as an intermediary adhesion layer (for example, adhesion layer 131 as shown in FIG. 1) may be deposited under UBM (for example, directly on the bonding pads before the deposition of the UBM) or over the UBM and the portion of each bonding pad not covered by UBM so that the superconducting solder bump may adhere to the adhesion layer. The UBM therefore gives more control of the height of the superconducting solder bumps and eliminates/reduces required monitoring of individual superconducting solder bump heights. By using this layer of UBM, superconducting solder bumps with substantially uniform height may be achieved such that the top of each superconducting solder bump may be substantially aligned with the top of each of the other superconducting solder bumps fabricated/formed on the superconducting chip. In other words, a line tangent to the top of a superconducting solder bump fabricated/formed on a superconducting chip may also be at least approximately (e.g., within manufacturing tolerances) tangential to the top of each of the other solder bumps fabricated/formed on the superconducting chip.

Figure 2:
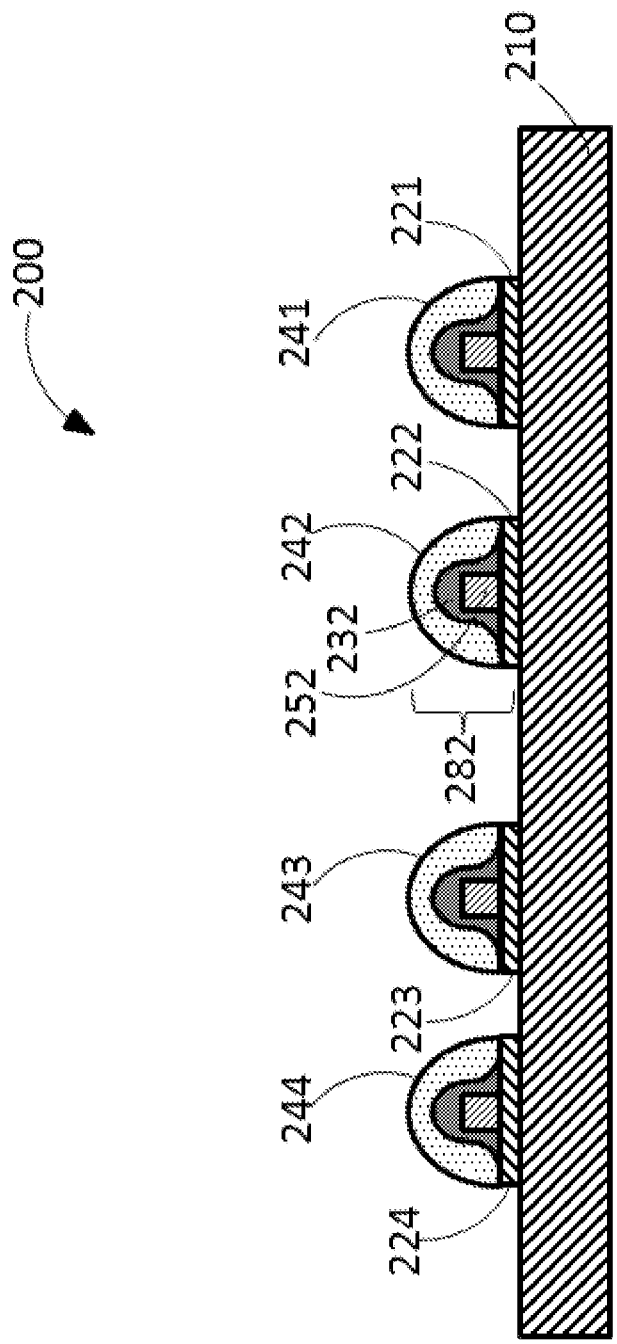
FIG. 2 is a sectional view of a superconducting chip with a first set of solder bumps fabricated over pillars of UBM in accordance with the present systems and methods.

FIG. 2 shows a sectional view of a superconducting chip 200 with a first set of superconducting solder bumps in accordance with the present systems and methods. Superconducting traces (e.g., bonding pads) 221, 222, 223, 224 are deposited over substrate 210 of superconducting chip 200. UBM (for example, UBM 252; only one called out in FIG. 2 to reduce clutter) is formed as a respective pillar over a portion of each bonding pad 221, 222, 223, 224. A respective superconducting "intermediary adhesion" layer (for example, superconducting adhesion layer 232; only one called out in FIG. 2 to reduce clutter) is deposited over each UBM (for example, UBM 252) and over a portion of the respective bonding pad that underlies each UBM. Superconducting solder bumps 241, 242, 243, 244 are deposited over respective superconducting intermediary adhesion layers (for example, superconducting adhesion layer 232). The materials of substrate 210, superconducting traces 221, 222, 223, 224 and superconducting solder bumps 241, 242, 243, 244 may be similar to the materials of substrate 110, superconducting traces 121, 122, 123, 124 and superconducting solder bumps 141, 142, 143, 144, respectively, of superconducting chip 100 as shown in FIG. 1. UBM (for example, UBM 252) may comprise a non-superconducting material such as copper or gold. Unlike in Ogashiwa, where copper was only used as a wiring layer, examples of the present systems and methods employ copper and/or gold to form UBM due to their hardness and ability to provide sufficient structural support to superconducting solder bumps. Similar to superconducting adhesion layers of FIG. 1 (for example, superconducting adhesion layers 131, 132, 133, 134), superconducting adhesion layers of superconducting chip 200 (for example, superconducting adhesion layer 232) may comprise superconducting material such as tin which provides adhesion to the superconducting solder bumps (for example, superconducting solder bumps 241, 242, 243, 244). Intermediary adhesion layer (for example, adhesion layer 232) may be deposited under UBM (for example, directly on the bonding pads before the deposition of the UBM) or over the UBM and the portion of each bonding pad not covered by UBM (for example, the portion of superconducting trace 222 not covered by UBM 252). Superconducting traces 221, 222, 223, 224, pillars of UBM formed on respective portions of each superconducting trace 221, 222, 223, 224 (for example, UBM 252), respective adhesion layers (for example, adhesion layer 232) and respective superconducting solder bumps 241, 242, 243, 244 collectively form "interconnection structures" providing continuous, uninterrupted superconducting signal paths between superconducting chip 200 and a module such as a testing module or a chip packaging module to which superconducting chip 200 may be attached. Only interconnection structure 282 comprising superconducting trace (i.e., bonding pad) 222, UBM 252, adhesion layer 232 and superconducting solder bump 242 is called out in FIG. 2 to reduce clutter. Although the material of UBM (for example, copper and/or gold) may be non-superconducting, an uninterrupted superconducting path may still be formed around the pillar of UBM and on the periphery of the interconnection structures through direct superconductive electrical connection between a superconducting solder bump (e.g., bump 242) and a superconducting adhesion layer (e.g., adhesion layer 232), where there is a direct superconductive electrical connection between the adhesion layer and an underlying superconducting trace/bonding pad (e.g., bonding pad 222). For example, superconducting signals can transfer from superconducting trace 222 into adhesion layer 232 formed on a portion of superconducting trace 222 and "around" UBM 252 into superconducting solder bump 242 formed on adhesion layer 232 because all of superconducting trace 222, adhesion layer 232 and superconducting solder bump 242 are formed of superconducting materials. Therefore, unlike in U.S. Pat. No. 5,440,239, the interconnection structures of superconducting chip 200 (for example, superconducting interconnection structure 282) are able to carry uninterrupted superconducting signals even when the UBM (for example, UBM 252) comprises a non-superconducting material. A superconducting chip may comprise at least one such interconnection structure, and may employ tens, hundreds, or even thousands of such interconnection structures. A person of skill in the art will appreciate that while only four interconnection structures are shown in FIG. 2, this number is arbitrary and a superconducting chip may include more or fewer than four interconnection structures.

UBM of superconducting chip 200 (for example, UBM 252) may alternatively comprise a superconducting material such as niobium so that UBM may also be superconducting and therefore the entire interconnection structure (for example, interconnection structure 282) may be superconducting. This provides a continuous/uninterrupted superconducting current to flow through the interconnection structures such as interconnection structure 282 while providing a uniform solder bump height across the interconnection structures superconducting chip 200 (for example, interconnection structure 282). The superconducting current flowing through the interconnection structures (for example, interconnection structure 282) when the corresponding UBM (for example, UBM 252) comprise of a superconducting material may have a higher critical current than when the UBM comprise of non-superconducting materials due to the entire interconnection structure being superconducting. If UBM (for example, UBM 252) comprise of a superconducting material such as osmium, rhenium, ruthenium and the like, corresponding adhesion layers (for example, adhesion layer 232) may not be required as superconducting solder bumps may adhere well to UBM comprising such superconducting materials.

Figure 3:
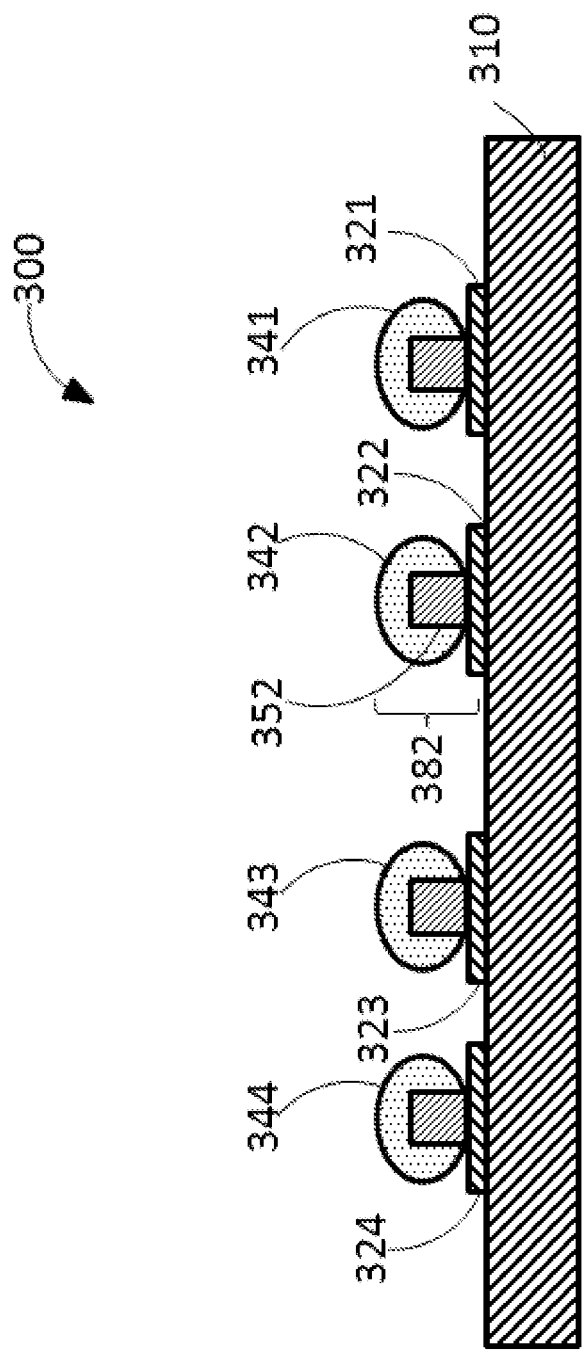
FIG. 3 is a sectional view of a superconducting chip with a first set of solder bumps fabricated over superconducting pillars of UBM without the use of superconducting layers formed in FIG. 1 in accordance with the present systems and methods.

FIG. 3 shows a sectional view of a superconducting chip 300 with a first set of superconducting solder bumps fabricated over superconducting pillars of UBM without the use of intermediary adhesion layers in accordance with the present systems and methods. Similar to FIGS. 1 and 2, superconducting traces 321, 322, 323, 324 are deposited over substrate 310 of superconducting chip 300. Similar to FIG. 2, UBM (for example, UBM 352; only one called out in FIG. 3 to reduce clutter) is formed as a pillar over a portion of each superconducting trace 321, 322, 323, 324. Superconducting solder bumps 341, 342, 343, 344 are deposited over respective UBM (for example, UBM 352). Similar to FIGS. 1 and 2, superconducting traces 321, 322, 323, 324 may also be referred to as "bonding pads." Unlike in FIG. 2, the UBM on superconducting chip 300 (for example UBM 352) comprises superconducting materials such as osmium, rhenium, ruthenium and/or the like or a combination thereof. Such superconducting materials are chosen for UBM for their hardness, ability to provide structural support to the respective superconducting solder bumps formed thereon, and ability to be wetted by molten superconducting solder in the presence of flux (i.e., their ability to adhere to superconducting solder). Superconducting UBM such as UBM 352 may be deposited on pre-cleaned niobium surfaces of superconducting traces 321, 322, 323, 324. The superconducting material(s) of solder bumps 341, 342, 343, 344, such as tin/lead, is able to adhere directly to the superconducting UBM (for example, UBM 352) because the materials chosen for superconducting UBM (for example, osmium, rhenium, ruthenium) adhere well to solder. However, as previously mentioned, since superconducting solder (i.e., solder bumps 341, 342, 343, 344) does not adhere to the niobium of superconducting traces 321, 322, 323, 324, FIG. 3 shows superconducting solder bumps 341, 342, 343, 344 formed around and over respective superconducting UBM (for example, UBM 352) but with very little contact with superconducting traces 321-324. The materials of substrate 310, superconducting traces 321, 322, 323, 324 and superconducting solder bumps 341, 342, 343, 344 are similar to the materials of respective substrate 110, superconducting traces 121, 122, 123, 124 and superconducting solder bumps 141, 142, 143, 144 of superconducting chip 100 as shown in FIG. 1. Similar to FIG. 2, superconducting UBM (for example, UBM 352) provides structural support to the superconducting solder bumps so that a substantially uniform height may be achieved across the superconducting solder bumps fabricated on superconducting chip 300. This important aspect of forming superconducting UBM to provide an uninterrupted superconducting current path as well as a substantially uniform solder bump height is not taught in, for example, Ogashiwa. Similar to FIGS. 1 and 2, each of superconducting traces 321, 322, 323, 324, the respective superconducting UBM formed on a portion of each of superconducting traces 321, 322, 323, 324 (for example, UBM 352) and the respective superconducting solder bump 341, 342, 343, 344 formed on each superconducting UBM, collectively form "interconnection structures." Each interconnection structure forms an uninterrupted superconducting signal path between superconducting chip 300 and a module such as a testing module or a chip packaging module to which superconducting chip 300 may be attached. Only interconnection structure 382 comprising superconducting trace 322, superconducting UBM 352 and superconducting solder bump 342 is called out in FIG. 3 to reduce clutter. Unlike in U.S. Pat. No. 5,440,239, all of superconducting traces 321, 322, 323, 324, superconducting UBMs (for example, UBM 352) and superconducting solder bumps 341, 342, 343, 344 comprise superconducting materials so that superconducting signals may be transferred uninterrupted (i.e., without passing through a non-superconducting or resistive component) through the interconnection structures (e.g., interconnection structure 382) of superconducting chip 300. A superconducting chip may comprise of at least one interconnection structure. A person of skill in the art will appreciate that while four interconnection structures are shown in FIG. 3, this number is arbitrary and a superconducting chip may include more or fewer than four interconnection structures. UBM (for example, UBM 352) may also comprise non-superconducting materials. If UBM comprise non-superconducting materials, an uninterrupted superconducting current path may still be established through the interconnection structures (for example, interconnection structure 382) via a superconducting layer such as a superconducting intermediary adhesion layer interposed between a superconducting trace (for example, superconducting trace 322) and a respective UBM (for example, respective UBM 352).

Although FIGS. 1, 2 and 3 show superconducting solder bumps carried on a superconducting chip such that the superconducting chip may be attached to a respective testing module, the superconducting solder bumps may alternatively be formed on the testing module instead of on the superconducting chip. In fact, since superconducting solder bump formation requires reflow of solder where solder is melted by the application of heat, if the solder bumps are formed on a superconducting chip the superconducting chip may also be exposed to the applied heat and this may adversely affect properties of the superconducting chip. For example, heating a superconducting chip may degrade Josephson junctions (specifically, the barrier in a Josephson junction) and/or other components on a superconducting chip. Therefore, in some instances it may be advantageous to form superconducting solder bumps on the testing module rather than on the superconducting chip. A person of skill in the art will appreciate that superconducting solder bumps may be formed on a superconducting chip or alternatively on a respective testing module, and in either case the superconducting chip may be attached to the respective testing module via the superconducting solder bumps.

Once the interconnection structures have been formed on a superconducting chip (for example, interconnection structure 281 of superconducting chip 200 as shown in FIG. 2), or alternatively on a testing module, the superconducting chip may be attached to the testing module so that the electrical properties of the superconducting chip (i.e., superconducting chip 200) may be tested.

Figure 4:
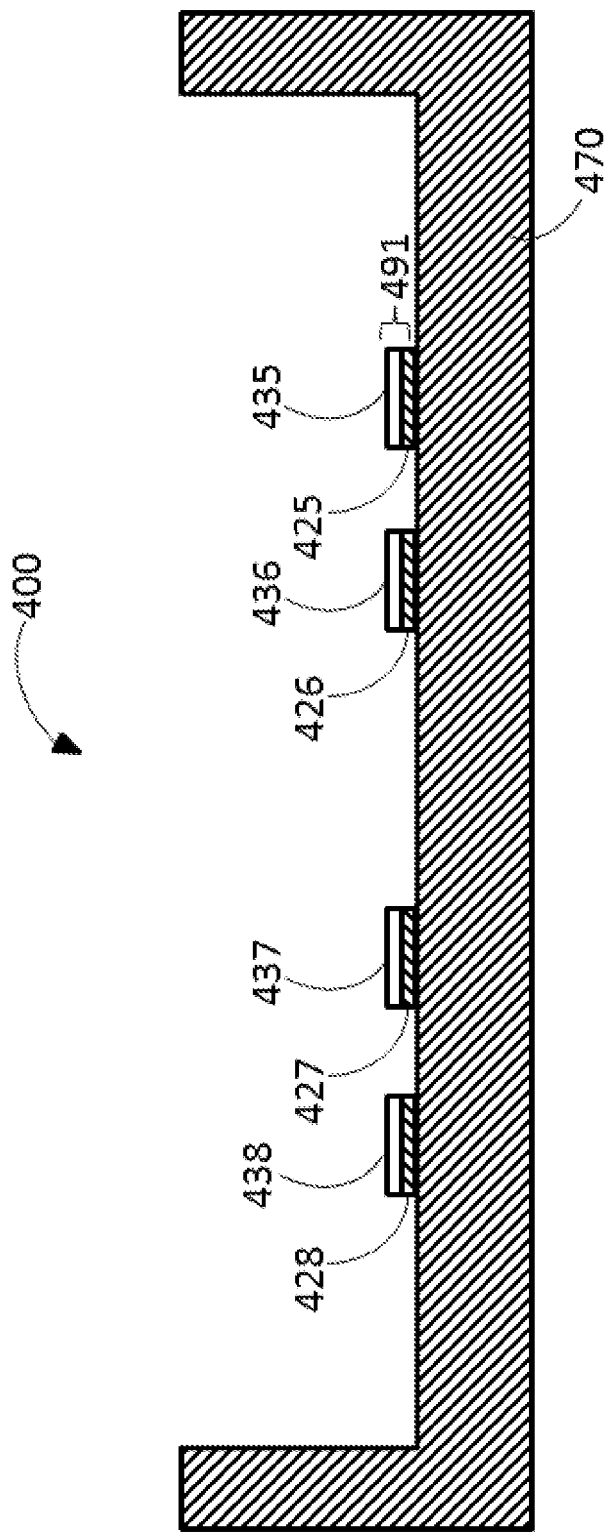
FIG. 4 is a sectional view of a testing module in accordance with the present systems and methods.

FIG. 4 shows a sectional view of a superconducting testing module 400 in accordance with the present systems and methods. Testing module 400 is a temporary carrier/holder module for a superconducting chip. Superconducting traces 425, 426, 427, 428 are formed on a surface of substrate 470 of testing module 400. A superconducting chip (e.g., any of superconducting chips 100, 200, 300) may be attached to testing module 400 at the approximate regions of superconducting traces 425, 426, 427, 428. A superconducting chip (e.g., superconducting chip 100, 200, 300) may be attached to testing module 400 via superconducting solder bumps formed on the superconducting chip. For example, superconducting chip 100 may be attached to testing module 400 via superconducting solder bumps 121, 122, 123 and 124 by establishing a respective superconducting electrical connection between each of superconducting solder bumps 121-124 and superconducting traces 425, 426, 427, 428. Similarly, superconducting chip 200 may be attached to testing module 400 via superconducting solder bumps 221, 222, 223, 224 and superconducting chip 300 may be attached to testing module 400 via superconducting solder bumps 321, 322, 323, and 324. The fabrication of niobium superconducting traces is well established in the art; however, niobium does not readily form a strong bond with superconducting solder. In order to improve the adhesion between superconducting traces 425-428 and superconducting solder (e.g., the superconducting solder bumps of chips 100-300), each of superconducting traces 425-428 may include a respective superconducting intermediary adhesion layer 435, 436, 437, 438 similar to superconducting adhesion layers 131-134 from FIG. 1. Each of superconducting adhesion layers 435, 436, 437, 438 may comprise a superconducting material such as tin, osmium, rhenium, ruthenium or a combination thereof. Each of superconducting traces 425, 426, 427, 428 (and respective superconducting adhesion layers 435, 436, 437, 438 if included) may be referred to as "bonding pads" (for example, bonding pad 491) where the approximate region of a bonding pad of testing module 400 may serve as an approximate position where a superconductive electrical connection between testing module 400 and a superconducting chip (for example, superconducting chip 100, 200, or 300) is formed. Only bonding pad 491 comprising superconducting trace 425 and superconducting adhesion layer 435 is called out in FIG. 4 to reduce clutter. Superconducting solder bumps of a superconducting chip to be attached to testing module 400 (for example, superconducting solder bumps 241, 242, 243, 244 of superconducting chip 200 shown in FIG. 2) may be aligned with the bonding pads of testing module 400 and brought into physical contact with the corresponding superconducting intermediary adhesion layers (i.e., superconducting layers 435, 436, 437, 438) prior to being bonded. A person of skill in the art will appreciate that while four bonding pads (for example, bonding pad 491) are shown in FIG. 4, this number is arbitrary and a testing module may include more or fewer than four bonding pads. A testing module may hold one superconducting chip to be tested or a plurality of superconducting chips to be tested.

Although interconnection structures such as interconnection structure 382 of FIG. 3 with superconducting solder bumps are shown formed on a superconducting chip in FIGS. 1, 2, and 3 and bonding pads such as bonding pad 491 are shown formed on a testing module in FIG. 4, the bonding pads may alternatively be formed on the superconducting chip while the interconnection structures (e.g. comprising superconducting solder bumps) may be formed on the testing module. In other words, superconducting solder bumps may be formed on a testing module rather than on a superconducting chip. Such would essentially involve forming interconnection structures (e.g., interconnections structures 181, 282, or 382) on a testing module and bonding pads (e.g., bonding pad 491) on a superconducting chip. In fact, since superconducting solder bump formation requires reflow of solder by the application of heat, and the application of heat may damage components of a superconducting chip, in some instances it may be advantageous to form superconducting solder bumps on the testing module rather than on the superconducting chip.

Figure 5:
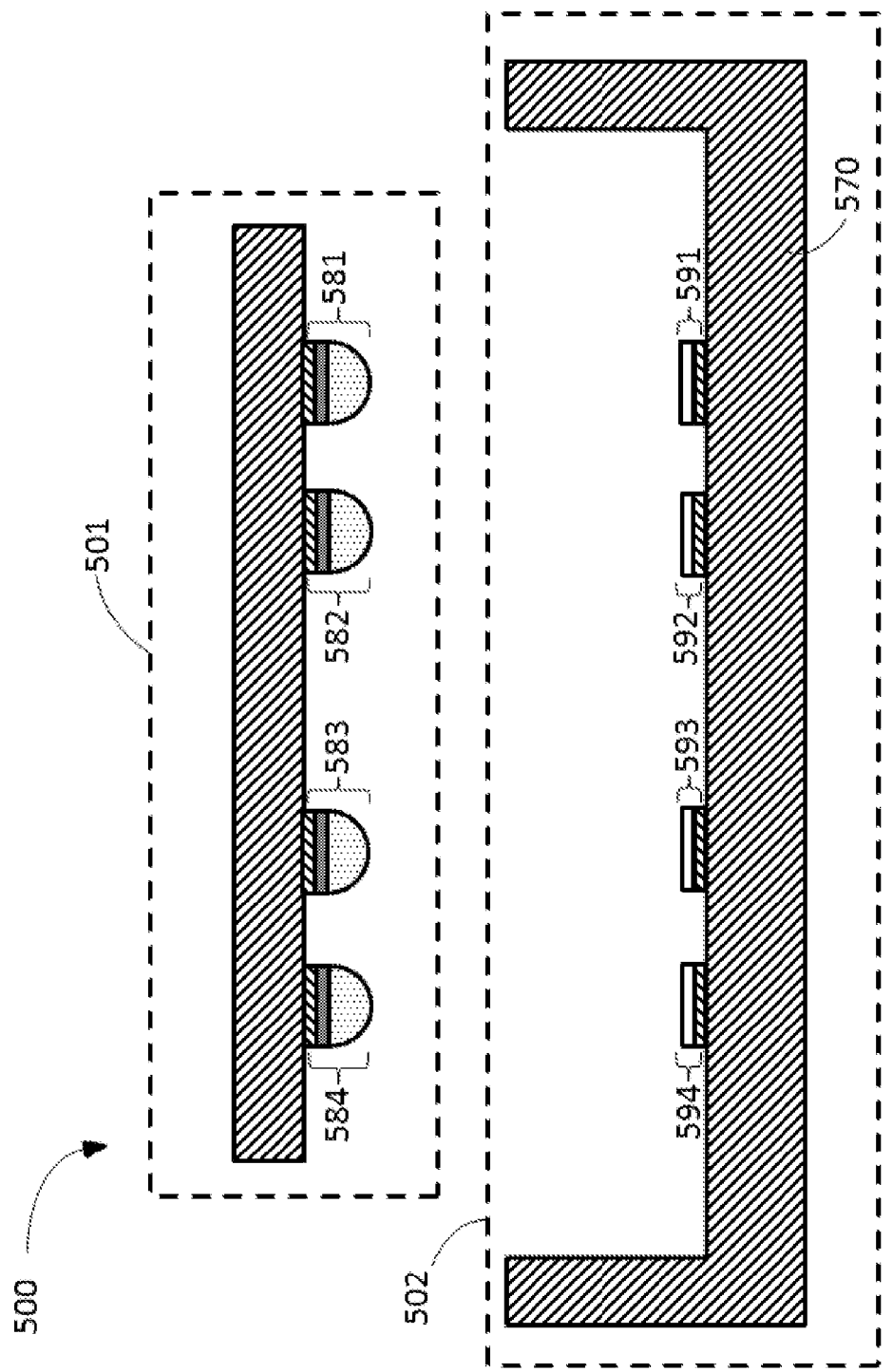
FIG. 5 is a sectional view of a testing assembly in accordance with the present systems and methods just prior to bonding a superconducting chip to a testing module as shown in FIG. 4.

FIG. 5 shows a sectional view of a testing assembly 500 in accordance with the present systems and methods. Testing assembly 500 comprises a testing module 502 (substantially similar to testing module 400 from FIG. 4) and a superconducting chip 501 (substantially similar to superconducting chip 100 from FIG. 1). As depicted in FIG. 5, superconducting chip 501 is positioned above testing module 502 such that superconducting interconnection structures 581-584 of chip 501 respectively align with superconducting bonding pads 591-594 of testing module 502. FIG. 5 depicts testing assembly 500 before superconducting chip 501 is bonded to testing module 502. As shown in FIG. 5, interconnection structures 581-584 of superconducting chip 501 comprise superconducting traces, superconducting intermediary adhesion layers formed on the superconducting traces and superconducting solder bumps formed on the superconducting adhesion layers in a manner that is substantially similar to superconducting chip 100 from FIG. 1. The composition and configuration of interconnection structures 581-584 is similar to that of superconducting chip 100 for exemplary purposes only. Superconducting chip 501 may, for example, employ the configuration and composition of interconnection structures employed on superconducting chip 200 of FIG. 2 and/or superconducting chip 300 of FIG. 3. Furthermore, as previously described, superconducting chip 501 may include superconducting bonding pads (e.g., similar to superconducting bonding pads 591-594) in place of superconducting interconnection structures 581-584 and testing module 502 may include superconducting interconnection structures (similar to superconducting interconnection structures 581-584) in place of superconducting bonding pads 591-594. In order to establish superconductive electrical connections between superconducting chip 501 and testing module 502, chip 501 and module 502 are positioned so that each of interconnection structures 581-584 aligns with and physically contacts a respective one of bonding pads 591-594. Testing assembly 500 is then heated (via, e.g., resistors conductively or radiatively coupled to testing assembly 500 or optical devices such as light-emitting diodes projecting photons onto testing assembly 500) to cause the superconducting solder bumps in interconnection structures 581-584 to soften and/or melt and adhere to bonding pads 591-594. Testing assembly 500 is then cooled so that the superconducting solder bumps harden and provide structural bonds and superconductive electrical connections between superconducting chip 501 and testing module 502. The resulting superconductive electrical connections provide continuous, uninterrupted superconducting signal paths between superconducting chip 501 and testing module 502. This feature of uninterrupted superconducting signal transmission through the superconducting signal paths established by the present systems and methods is not taught in, for example, U.S. Pat. No. 5,440,239 as such applications are carried out in the semiconductor industry. Further, some materials in the interconnection structures of U.S. Pat. No. 5,440,239 are non-superconducting (for example, top contact layer comprising gold, diffusion layer comprising copper or nickel/copper) and therefore interrupt any superconducting signal paths that may otherwise exist. Throughout the remainder of this specification, the technique of applying heat to melt/reflow solder bumps such that a superconducting chip may be attached to a testing/chip packaging module is referred to as "solder reflow process" or "reflow solder process." It should be noted that other such methods to attach superconducting chips to testing/chip packaging modules may exist such as thermal compression bonding, thermalsonic bonding, etc. The way in which a superconducting chip is brought into contact with a testing module is arbitrary, and is used in relative sense. A superconducting chip may be "lowered/raised" until its solder bumps make contact with the corresponding bonding pads of a testing module, or a testing module may be lowered/raised until the bonding pads of the testing module make contact with the corresponding solder bumps of the superconducting chip. The direction along which each of the superconducting chip and testing module are brought together is not important as long as the superconducting chip and the testing module are brought close together such that the solder bumps of one device (i.e., chip or module) make contact with the corresponding bonding pads formed on the other device (i.e., module or chip).

Once superconducting chip 501 has been attached to testing module 502, testing assembly 500 may be cooled to a temperature at or below the lowest critical temperature of the superconducting materials used in superconducting chip 501 and/or testing module 502. Such enables the continuous superconducting signal paths that physically connect superconducting chip 501 and testing module 502 together to become superconductive. Electrical properties of superconducting chip 501 may be tested by signals sent from and returned to testing module 502 through these superconducting signal paths. If superconducting chip 501 passes the electrical property testing, superconducting chip 501 may be labeled as a functional "good chip" and kept for final assembly onto a chip packaging module. Otherwise, if superconducting chip 501 does not pass electrical property testing, chip 501 may be discarded. Superconducting chip 501 may be pre-selected from a wafer containing a plurality of superconducting chips as a chip that may most likely pass electrical property testing based on yield statistics of the wafer, initial room temperature testing, etc. so that superconducting chip 501 has a relatively high probability of passing electrical property testing and being assembled onto a final chip packaging module. Testing module 502 may be a single-use, single-chip module or a multi-use, multi-chip module. For example, testing module 502 may be discarded after testing the electrical properties of superconducting chip 501 in a cryogenic environment, or it may be re-used to subsequently test a second chip. If superconducting chip 501 is identified as a "good chip" (i.e., if chip 501 passes electrical property testing), superconducting chip 501 is detached from testing module 502 so that superconducting chip 501 may be attached to a chip packaging module for final assembly. Superconducting chip 501 may be detached from testing module 502 by re-heating (i.e., reflowing) the superconducting solder connections between superconducting chip 501 and testing module 502 and separating superconducting chip 501 from testing module 502 while the superconducting solder is softened/liquefied.

A superconducting chip's electrical properties may be tested while the superconducting chip and the signal paths superconduct. The superconducting chip may be cooled by dipping the testing assembly comprising the superconducting chip and a testing module in liquid helium or by cooling the testing assembly using a cryocooler or other cryogenic refrigeration means. The typical electrical properties that may be tested include: resistance, current, capacitance, inductance, magnetic flux, etc. In order to test the properties of the components of a superconducting chip such as qubits, coupling devices, etc. the superconducting chip may be further cooled down to milliKelvin temperatures where there is minimum resistance and noise. A superconducting chip under test may be cooled down to milliKelvin temperatures by thermally connecting the superconducting chip to a dilution refrigerator. Therefore, at least two types of testing may be carried out depending on the need and resources: a quick, pre-test of the superconducting chip, or a comprehensive test of the components of the superconducting chip. A quick, pre-test may determine whether the superconducting chip under test is functional/defective. A superconducting chip may be cooled to a temperature below the lowest critical temperature of the superconducting materials used in a testing assembly (for example, testing assembly 500) so that the superconducting chip and the interconnections with the corresponding testing module may superconduct while performing a quick, pre-test. Unlike in, for example, Ogashiwa, a comprehensive test determines whether the components of a superconducting chip under test (for example, qubits, coupling devices, etc.) display desired quantum effects when a testing assembly is further cooled down to milliKelvin temperatures. A comprehensive test may be particularly important when assembling multiple superconducting chips into a single chip packaging module as a defective chip may affect the performance of the other superconducting chips assembled in the multi-chip packaging module. The various properties of the superconducting chip under test are tested by superconducting signals sent to and from the superconducting chip through the interconnections with the testing module. Thus, the formation of continuous, uninterrupted superconducting signal paths between superconducting chip and testing module is essential in order to ensure accurate characterization of the superconducting chip properties.

Figure 6:
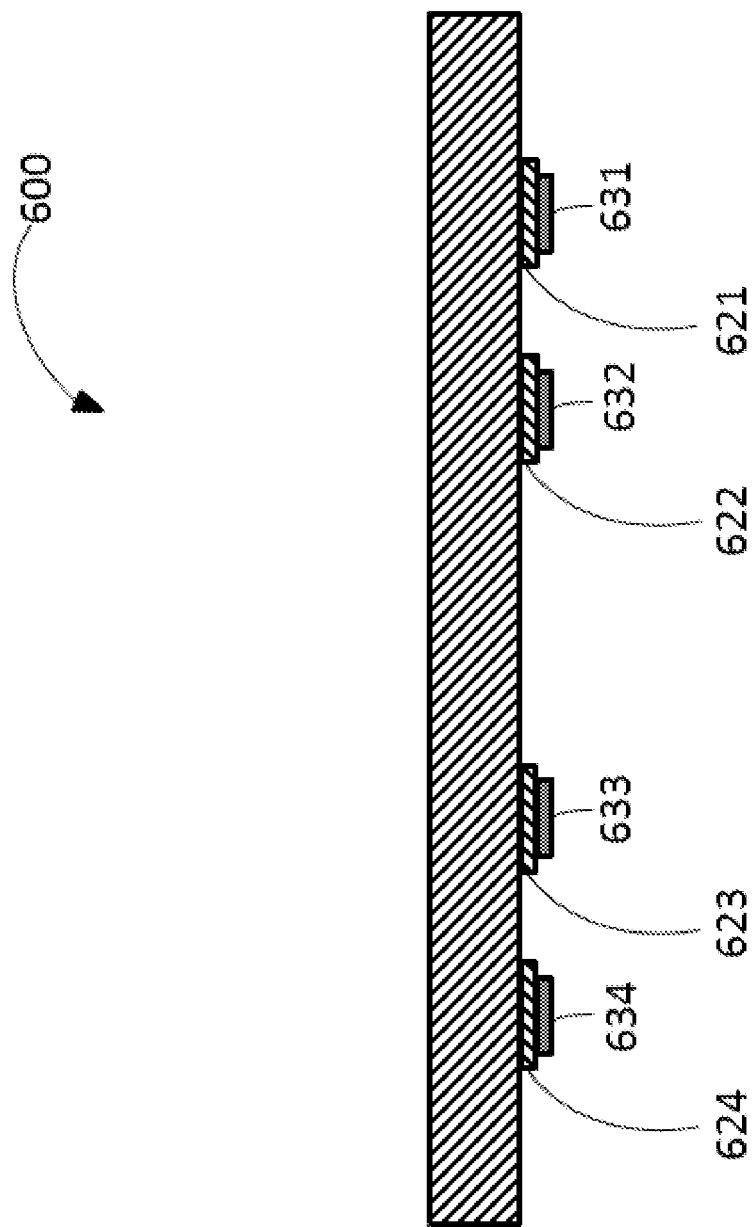
FIG. 6 is a sectional view of a superconducting chip after the superconducting chip has been detached from a testing module as shown in FIG. 4 in accordance with the present systems and methods.

FIG. 6 shows a sectional view of a superconducting chip 600 in accordance with the present systems and methods. Superconducting chip 600 is depicted with no superconducting solder bumps. As previously described, superconducting solder bumps may be deposited on a receiving module such as a testing module or a chip packaging module. In some applications, superconducting solder bumps may be deposited on a superconducting chip and used to connect the chip to a first "testing" module; however, these bumps will be removed when the chip is removed from the first "testing" module prior to being connected to a second "chip packaging" module. Thus, FIG. 6 depicts a superconducting chip 600 that has either been fabricated without superconducting solder bumps, or has been fabricated with superconducting solder bumps but the bumps have been removed after chip 600 has been detached from a testing module (for example, testing module 502 as shown in FIG. 5). In other words, superconducting chip 600 may represent superconducting chip 501 of FIG. 5 after being detached from testing module 502 following electrical property testing of superconducting chip 501. A superconducting chip such as superconducting chip 600 may be detached from a testing module (for example, testing module 502) by reflowing the superconducting solder connections established between interconnection structures 581-584 and bonding pads 591-594 via superconducting solder bumps. Superconducting chip 600 may include superconducting bonding pads and/or superconducting interconnection structures as described previously. For example, superconducting chip 600 may employ superconducting interconnection structures similar to interconnection structure 181 of superconducting chip 100 from FIG. 1, in which case superconducting chip 600 may include superconducting traces 621-624 and superconducting intermediary adhesion layers 631-634. However, superconducting chip 600 may also employ superconducting interconnection structures similar to interconnection structure 282 of superconducting chip 200 from FIG. 2 and/or interconnection structure 382 of superconducting chip 300 from FIG. 3 (i.e., superconducting chip 600 may employ UBM, not shown in FIG. 6), and/or superconducting chip 600 may employ superconducting bonding pads instead of superconducting interconnection structures. Superconducting solder bumps in interconnections structures 581-584 of superconducting chip 501 as shown in FIG. 5 may be removed in superconducting chip 600 by applying heat to testing assembly 500 of FIG. 5 which would cause the solder bumps to melt/reflow. Once the solder bumps melt, superconducting chip 501 may be detached from testing module 502. Solder (e.g., solder bumps) may be removed from superconducting chip 501 (i.e., to produce superconducting chip 600) without adversely affecting superconducting traces 621-624 and superconducting adhesion layers 631-634. For example, following electrical property testing of superconducting chip 300 shown in FIG. 3 and detachment of superconducting chip 300 from a corresponding testing module, superconducting chip 300 comprises superconducting traces 321, 322, 323, 324 and respective UBM formed on each superconducting trace 321, 322, 323, 324 only (i.e., UBM 352; only one called out in FIG. 3 to reduce clutter). Solder bumps are not shown in FIG. 6 to indicate that the solder bumps have been removed from superconducting chip 600. Alternatively, as previously described, if superconducting chip 600 were fabricated with bonding pads similar to the bonding pads of testing module 400 from FIG. 4 (for example, bonding pad 491), superconducting traces of superconducting chip 600 (for example, superconducting traces 621, 622, 623, 624) and corresponding superconducting adhesion layers of superconducting chip 600 (for example, corresponding superconducting adhesion layers 631, 632, 633, 634) will similarly remain on superconducting chip 600 after detachment from a testing module. Superconducting chip 600, having passed electrical property testing, is selected for final assembly onto a chip packaging module.

Figure 7:
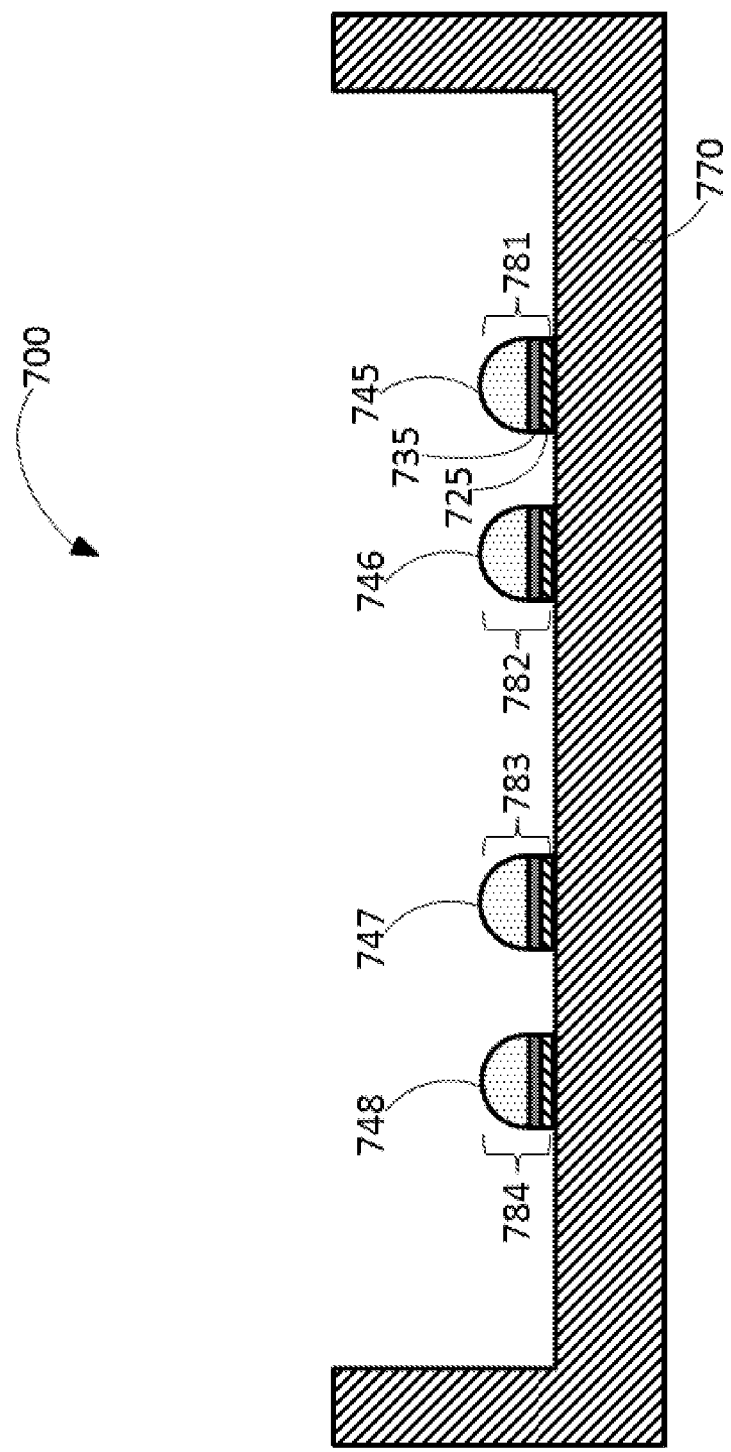
FIG. 7 is a sectional view of a chip packaging module with a second set of solder bumps fabricated on its surface in accordance with the present systems and methods.

FIG. 7 shows a sectional view of a chip packaging module 700 with a set of superconducting solder bumps 745, 746, 747, 748 fabricated on its surface in accordance with the present systems and methods. Chip packaging module 700 includes substrate 770. Substrate 770 is similar to substrate 470 of testing module 400 as shown in FIG. 4; however, substrate 770 of chip packaging module 700 carries superconducting solder bumps 745, 746, 747, 748 in addition to the superconducting layers formed on substrate 470 of FIG. 4. Chip packaging module 700 includes superconducting traces such as superconducting trace 725 (only one called out in FIG. 7 to reduce clutter) and superconducting intermediary adhesion layers such as superconducting adhesion layer 735 (only one called out in FIG. 7 to reduce clutter). Chip packaging module 700 includes interconnection structures 781, 782, 783, 784. Interconnection structures 781, 782, 783, 784 may be similar in structure and composition to interconnection structure 181 of FIG. 1, interconnection structure 282 of FIG. 2, and/or interconnection structure 382 of FIG. 3. For example, if interconnection structures 781, 782, 783, 784 are formed similar to interconnection structure 382 of FIG. 3, superconducting traces such as superconducting trace 725 comprise a superconducting material such as niobium, superconducting adhesion layers such as superconducting adhesion layer 735 may include pillars of UBM comprising superconducting materials such as osmium, rhenium, ruthenium and the like or a combination thereof, and superconducting solder bumps 745, 746, 747, 748 comprise superconducting materials such as tin, lead and the like or a combination thereof. A superconducting chip may be attached to chip packaging module 700 via superconducting solder bumps 745, 746, 747, 748. A superconducting chip that has passed the electrical property testing and is selected to be used in the final chip assembly (for example, superconducting chip 600 of FIG. 6) may be attached to chip packaging module 700 via superconducting solder bumps 745, 746, 747, 748. For example, superconducting traces of FIG. 6 (i.e., superconducting traces 621, 622, 623, 624) may be aligned with respective ones of superconducting solder bumps 745, 746, 747, 748 of chip packaging module 700 and brought close together such that superconducting adhesion layers 631, 632, 633, 634 of superconducting chip 600 each are in physical contact with a respective one of superconducting solder bumps 745, 746, 747, 748 of chip packaging module 700. Once superconducting solder bumps 745, 746, 747, 748 are in physical contact with superconducting adhesion layers 631, 632, 633, 634 of superconducting chip 600, superconducting chip 600 is superconductively electrically and physically coupled to chip packaging module 700 by a solder reflow process. Once a superconducting chip has been attached to a chip packaging module such as chip packaging module 700, the chip packaging module may be assembled into a device such as a superconducting computer system (e.g., a superconducting quantum computing system). Reusing the components of the interconnection structures and/or bonding pads (e.g., superconducting traces 621, 622, 623, 624 and superconducting adhesion layers 631, 632, 633, 634 of superconducting chip 600 from FIG. 6) after the superconducting chip has been detached from the testing module (i.e., after a first set of superconducting solder connections to the chip has been destroyed) so that the superconducting chip without the first set of superconducting solder bumps may be attached to a chip packaging module reduces the redundancy of resources needed to fabricate superconducting signal paths between the superconducting chip and the chip packaging module which can be of advantage when testing and packaging a large number of superconducting chips.

A chip packaging module such as chip packaging module 700 may comprise any number of interconnection structures. Although four interconnection structures are shown in chip packaging module 700 of FIG. 7, this number is arbitrary and a chip packaging module may have more or fewer than four interconnection structures. A chip packaging module may be capable of carrying one superconducting chip or a plurality of superconducting chips (i.e., a chip packaging module may be a multi-chip module). A chip packaging module comprising a plurality of superconducting chips attached to its substrate may comprise superconducting paths interconnecting the plurality of superconducting chips in the chip packaging module together which may enable multi-chip processing.

Although FIG. 7 shows superconducting solder bumps formed on a chip packaging module such that a functional superconducting chip may be attached to the chip packaging module, the superconducting solder bumps may alternatively be formed on the superconducting chip instead of on the chip packaging module. In applications in which the superconducting chip employs Josephson junction devices, it can be advantageous to form superconducting solder bumps on the receiving modules (i.e., a first set of superconducting solder bumps on the testing module and a second set of superconducting solder bumps on the chip packaging module) to minimize heating of the sensitive Josephson junctions on the superconducting chip.

Figure 8:
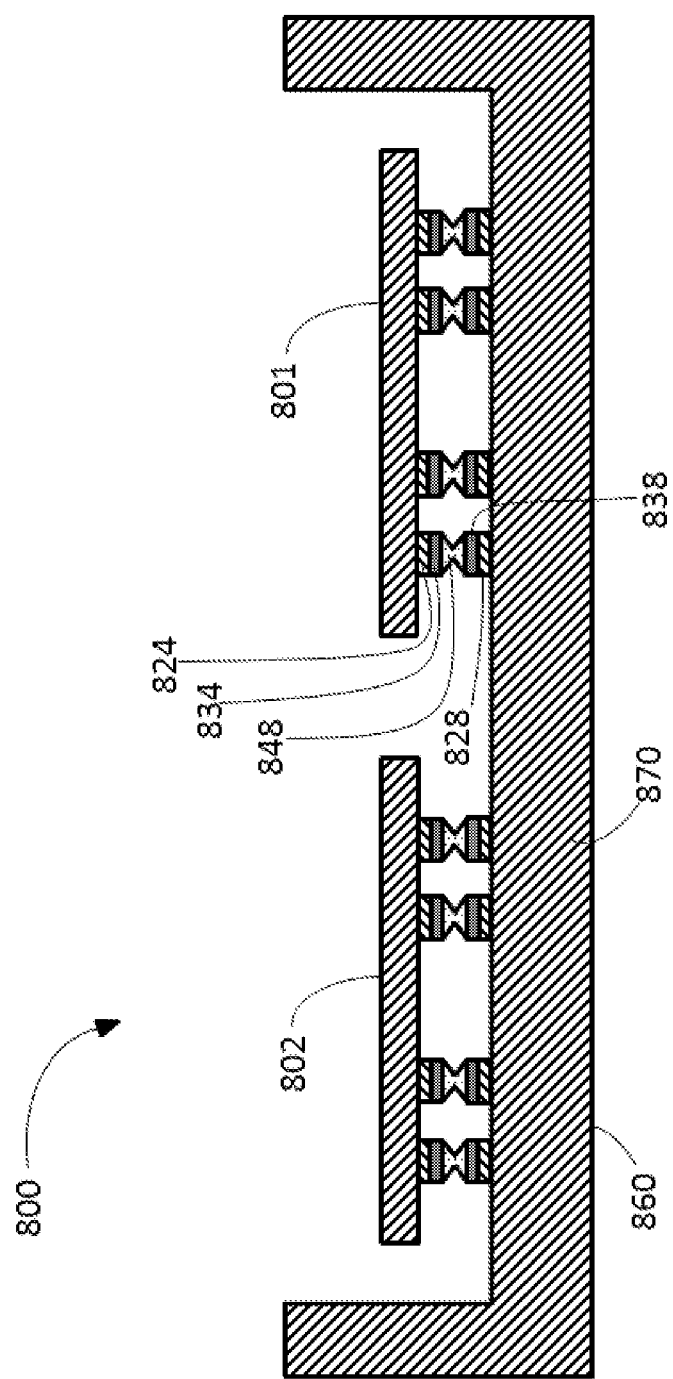
FIG. 8 is a sectional view of a chip packaging assembly with multiple superconducting chips attached to a chip packaging module such as the chip packaging module of FIG. 7 in accordance with the present systems and methods.

FIG. 8 shows a sectional view of a chip packaging assembly 800 with multiple superconducting chips 801, 802 attached to substrate 870 chip packaging module 860 in accordance with the present systems and methods. Chip packaging module 860 is similar to chip packaging module 800 of FIG. 8, however, chip packaging module 860 is designed to hold at least two superconducting chips 901 and 902. Those of skill in the art will appreciate that although chip packaging assembly 800 shows two superconducting chips that have been attached to chip packaging module 860, a given chip packaging module may hold more or fewer than two superconducting chips. Similar to FIG. 7, chip packaging module 860 of chip packaging assembly 800 includes substrate 870, superconducting traces (for example, superconducting trace 828), superconducting intermediary adhesion layers fabricated on the superconducting traces (for example, superconducting adhesion layer 838) and superconducting solder bumps fabricated on the superconducting adhesion layers (for example, solder 848). Similar to FIG. 6, superconducting chips 801, 802 include superconducting traces (for example, superconducting trace 824) and corresponding superconducting adhesion layers (for example, superconducting adhesion layer 834). Only superconducting trace 828, superconducting adhesion layer 838 and superconducting solder 848 of chip packaging assembly 800 and superconducting trace 824 and superconducting adhesion layer 834 of superconducting chip 801 are called out in FIG. 8 to reduce clutter. Similar to the procedure described in FIG. 7, superconducting chips 801, 802 are attached to substrate 870 of chip packaging module 860 via a solder reflow process. Superconducting solder bumps fabricated on the superconducting layers/bonding pads of chip packaging module 860 (i.e., to form superconducting interconnection structures) have undergone a solder reflow process in order to physically and superconductively electrically couple superconducting chips 801, 802 to chip packaging module 860. Therefore, the shape of solder bumps as shown in FIG. 8 (for example, solder 848) is different from that of the solder bumps drawn in FIG. 7 (i.e., solder bumps 745, 746, 747, 748) to indicate that upon reflowing of solder, the solder bumps of chip packaging module 860 (for example, solder 848) have melted and changed their shape. Superconducting chips 801, 802 may be fabricated similar to any of superconducting chips 100 of FIG. 1, 200 of FIG. 2, 300 of FIG. 3, or 600 of FIG. 6. Similar to superconducting chip 600 of FIG. 6, electrical properties of superconducting chips 801, 802 have been tested by attaching each of superconducting chips 801, 802 to a testing module (for example, testing module 400 of FIG. 4; each may have been attached to a respective single-chip testing module or to a common multi-chip testing module) and testing the electrical properties of each of superconducting chips 801, 802.

As previously described, a superconducting chip such as superconducting chip 801 and/or 802 may include superconducting bonding pads (for example, bonding pad 491 of FIG. 4) in which case a corresponding testing module may include superconducting interconnection structures comprising a first set of superconducting solder bumps (for example, interconnection structure 382 of FIG. 3) so that the superconducting chip may be attached to the testing module via superconducting solder bumps fabricated on the testing module instead of the superconducting chip. If such superconducting chip passes electrical property testing, the superconducting chip may be detached from the testing module and re-attached to a chip packaging module. Prior to attaching a functional superconducting chip to a chip packaging module, interconnection structures comprising a second set of superconducting solder bumps may be formed on the chip packaging module so that the bonding pads of the functional superconducting chip may be attached to the interconnection structures of the chip packaging module via superconducting solder bumps fabricated on the chip packaging module. Therefore, which device may include interconnection structures comprising superconducting solder bumps and which device may include bonding pads is dependent on the specific implementation. Either way, continuous, uninterrupted superconducting signal paths between superconducting chip and testing module and between superconducting chip and chip packaging module may be established.

Once the superconducting chip/chips have been assembled as shown in chip packaging assembly 800 in FIG. 8, chip packaging assembly 800 may be integrated into a computing system such as a quantum computer capable of processing quantum information. Unlike in U.S. Pat. No. 5,440,239, the signal paths formed between the superconducting chips and the chip packaging module (for example, the signal path formed by superconducting trace 828, superconducting adhesion layer 838, superconducting solder 848, superconducting adhesion layer 834, and superconducting trace 824) are able to transmit continuous, uninterrupted superconducting signals to and from superconducting chips

801, 802 and between superconducting chips 801, 802 thereby enabling multi-chip superconducting signal processing.

Figure 9:
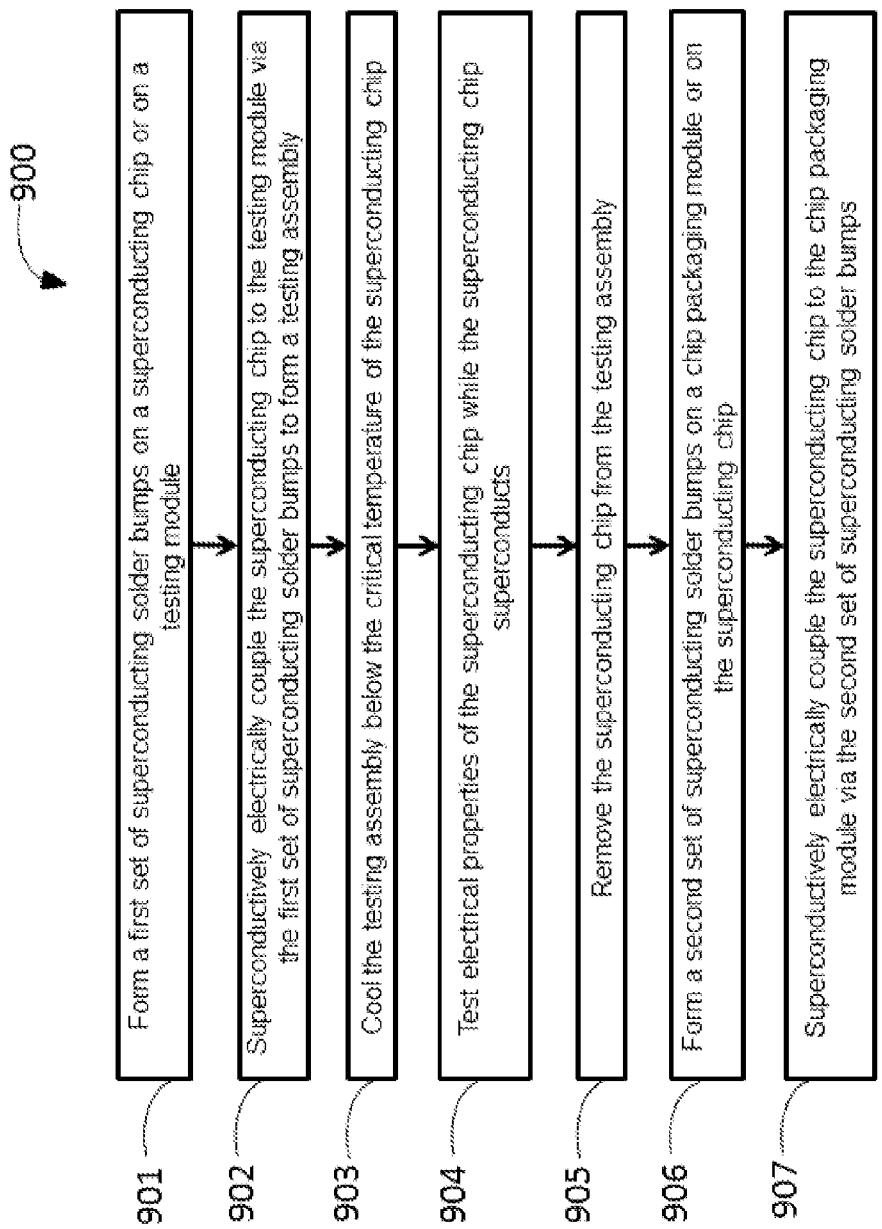
FIG. 9 is a flow-diagram showing a method of testing and packaging a superconducting chip in accordance with the present systems and methods.

FIG. 9 shows a flow-diagram of a method 900 for testing and packaging a superconducting chip in accordance with the present systems and methods. Method 900 includes seven acts 901-907, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 901, a first set of superconducting solder bumps is formed, either on a superconducting chip or on a testing module. The first set of superconducting solder bumps may be formed on top of a superconducting bonding pad that may include an intermediary adhesion layer and/or a pillar of UBM to form a superconducting interconnection structure as described in FIGS. 1-3 above. Both the superconducting chip and the testing module may include superconducting bonding pads (and UBM, if necessary) upon which the first set of superconducting solder bumps may be formed. The combination of superconducting bonding pad and superconducting solder bump (including UBM, if applicable) is referred to herein as a superconducting interconnection structure. Thus, superconducting interconnection structures may be formed on the superconducting chip and the testing module may carry superconducting bonding pads, or superconducting interconnection structures may be formed on the testing module and the chip may carry superconducting bonding pads.

At 902, the superconducting chip is physically and superconductively electrically coupled to a testing module via the first set of superconducting solder bumps to form a testing assembly. The superconducting chip may be coupled to the testing module by coupling the superconducting interconnection structures of the chip/module to the superconducting bonding pads of the module/chip via a solder reflow process, as depicted in, e.g., FIG. 5. Prior to coupling the superconducting chip to the testing module, respective ones of the superconducting interconnection structures of the chip/module are aligned with respective ones of the superconducting bonding pads of the module/chip such that superconducting interconnection structure couples with a corresponding superconducting bonding pad. The interconnections formed between testing module and superconducting chip provide continuous, uninterrupted superconducting signal paths between the two devices. For example, bonding pad 591 formed on testing module 502, together with corresponding superconducting interconnection structure 581 of superconducting chip 501 collectively form a continuous, uninterrupted superconducting signal path between testing module 502 and superconducting chip 501

At 903, the testing assembly is cooled to/below a critical temperature at which the superconducting chip as well as the superconducting signal paths between the superconducting chip and the testing module superconduct. The testing assembly may be cooled by dipping the testing assembly in liquid helium or by using a refrigeration system (e.g., a cryocooler or a dilution refrigerator) capable of cooling the testing assembly. The purpose of cooling the testing assembly is to enable the superconducting chip and the superconducting signal paths between the superconducting chip and the testing module to become superconductive so that superconducting signals may transfer through the signal paths to and from the superconducting chip.

At 904, the electrical properties of the superconducting chip are tested while the superconducting chip superconducts. Depending on the requirements, at least two types of tests may be performed on a superconducting chip: a quick pre-test or a comprehensive test. A quick pre-test tests the electrical properties of the superconducting chip such as resistance, current, capacitance, inductance, magnetic flux, etc. so that the superconducting chip may be characterized as a functional, "good chip" or a defective chip. A quick pre-test is carried out by cooling the testing assembly (for example, testing assembly 500) down to the lowest critical temperature of the superconducting materials in the superconducting chip and the superconducting signal paths between the superconducting chip and the testing module. A testing assembly undergoing a quick pre-test may be cooled by dipping the testing assembly in liquid helium or by using a refrigeration system. A comprehensive test is performed to assess the behavior properties of the components of the superconducting chip such as qubits and coupling devices so that the components of the superconducting chip may be characterized as "functional" or "defective." This kind of comprehensive testing is particularly important when assembling multiple superconducting chips in a single chip packaging module as defective components in one chip may affect the performance of other chips. Therefore, in order to perform a comprehensive test on a superconducting chip, the testing assembly comprising a testing module and an attached superconducting chip may be cooled further down to milliKelvin temperatures where noise (e.g., thermal noise) is significantly reduced in the circuitry. Dipping the testing assembly in liquid helium or cooling the testing assembly using a cryocooler can bring the temperature of the testing assembly down to approximately 1-4K. By thermally connecting the testing assembly to a dilution refrigerator, the testing assembly can be cooled further down to milliKelvin temperatures. In U.S. Pat. No. 5,440,239, the test module comprising a test device and a semiconducting die was tested for reliability in a high temperature environment. Thus, there was no real need for forming interconnection paths that would minimize noise and superconduct at milliKelvin temperatures so that the components of the chip could be tested (i.e., a comprehensive test). In the present systems and methods, the electrical properties of the superconducting chip may be tested by sending and receiving superconducting signals to and from the superconducting chip via a superconducting path (i.e., signal path). The signals sent to the superconducting chip may originate in room temperature electronics, and may flow through the signal paths between the testing module and the superconducting chip. If the superconducting chip passes the electrical property tests and is considered a "functional/good chip," it is used for final assembly into a chip packaging module.

At 905, the superconducting chip is removed from the testing assembly by detaching the superconducting chip from the testing module. The superconducting chip may be detached from the testing module by applying heat, causing the solder bumps to melt/reflow. Once the solder bumps are melted they may be removed from the superconducting chip such that the superconducting bonding pads (including UBM, if applicable) remain on the superconducting chip (i.e., superconducting chip 600 of FIG. 6). If the superconducting chip has passed electrical property testing and is thus considered a functional, "good chip", the superconducting chip detached from the testing module and with solder bumps removed may be subsequently superconductively electrically coupled to a chip packaging module.

At 906, a second set of superconducting solder bumps is formed on a chip packaging module or on the superconducting chip. Forming the second set of solder bumps is carried out in a similar way to forming the first set of superconducting solder bumps of act 901. For example, FIG. 7 shows a sectional view of a chip packaging module 700 on a surface of which interconnection structures 781, 782, 783, 784 are formed. Interconnection structures 781, 782, 783, 784 include superconducting solder bumps 745, 746, 747, and 748, respectively. A superconducting chip that passes electrical property testing in act 904 may be physically and superconductively electrically coupled to a chip packaging module (for example, chip packaging module 700 of FIG. 7) after forming interconnection structures comprising a second set of superconducting solder bumps on the chip packaging module (or on the superconducting chip), in accordance with the present systems and methods.

At 907, the superconducting chip is physically and superconductively electrically coupled to the chip packaging module via the second set of superconducting solder bumps. The superconducting chip is coupled to the chip packaging module similar to the way the superconducting chip is attached to the testing module at act 902. The chip packaging module may be capable of carrying one superconducting chip or a plurality of superconducting chips. Multiple superconducting chips that each go through acts 901-905 (and 906 if the second set of superconducting solder bumps are formed on the superconducting chip) and that pass electrical property testing at act 904 may be coupled to a chip packaging module depending on the capacity of the chip packaging module (i.e., the number of chips that can be coupled to the chip packaging module). When multiple superconducting chips are attached to a single chip packaging module, each superconducting chip may galvanically and/or capacitively and/or inductively interact with at least one other superconducting chip on the chip packaging module. Components of superconducting chips (e.g., qubits, couplers, etc.) may be galvanically coupled to each other via superconducting signal paths created between pairs of the superconducting chips and between each superconducting chip and the chip packaging module. For example, FIG. 8 shows a sectional view of a chip packaging assembly 800 with two superconducting chips (i.e., superconducting chips 801, 802) coupled to chip packaging module 860. Each of superconducting chips 801 and 802 may be coupled to chip packaging module 860 in series by a sequence of solder reflow processes, or both superconducting chips 801 and 802 may be coupled to chip packaging module 860 simultaneously using a single solder reflow process. In other words, each chip may undergo a respective solder reflow process or multiple chips (e.g., all chips) may undergo solder reflow at approximately the same time.

As previously described, forming superconducting solder bumps on a superconducting chip is a high temperature process and can lead to degradations in Josephson junctions that may be present on the superconducting chip. Therefore, it may be preferable to form at least one of, and in some cases both, the first set of superconducting solder bumps and the second set of superconducting solder bumps on the respective receiving modules (i.e., the first set of superconducting solder bumps on the testing module and the second set of superconducting solder bumps on the chip packaging module). Furthermore, when forming superconducting solder bumps on a superconducting chip, typically superconducting solder bumps are formed across the entire surface of the wafer comprising a plurality of superconducting chips prior to dicing each superconducting chip from the wafer as it is cheaper to form superconducting solder bumps on superconducting chips contained in the wafer. However, since not all superconducting chips in a single wafer may be a functional/good chip, it may be a waste of resources to form superconducting solder bumps on a superconducting chip prior to testing the electrical properties of the superconducting chip as the superconducting chip may/may not be kept for final assembly onto a chip packaging module depending on the outcome of electrical property testing of the superconducting chip. Also, it may not be economically viable to form a second set of solder bumps on a functional/good chip after the superconducting chip has been diced from the wafer since forming superconducting solder bumps on individual superconducting chips is more expensive than forming superconducting solder bumps on all superconducting chips prior to being diced from the wafer.

A uniform height of the superconducting solder bumps may be achieved, for example, by controlling the height of the respective pillars of UBM. It is important to ensure a uniform superconducting solder bump height across the superconducting interconnection structures formed on a superconducting chip, testing module, or chip packaging module such that when a superconducting chip is coupled to a corresponding testing/chip packaging module, there may be no unintentional shorts between the superconducting signal paths and no superconducting signal paths may be floating. Those of skill in the art will appreciate that the term "uniform" is used loosely in this specification and that any set of superconducting solder bumps and therefore a set of superconducting interconnection structures with a "uniform height" may each have slightly different height or a substantially uniform height, for instance in accordance with typical manufacturing or fabrication tolerances.

UBM formed on superconducting bonding pads may be formed as pillars of a certain height that would achieve the desired height of the superconducting solder bumps and therefore the overall height of the superconducting interconnection structures formed on a superconducting chip, testing module, or chip packaging module. UBM formed on a superconducting chip, testing module, or chip packaging module is optional and therefore, unless explicitly stated, the interconnections structures and/or bonding pads of the superconducting chips, testing modules, and chip packaging modules in the present systems and methods may or may not include UBM.

A superconducting chip may be attached to a module (e.g., a testing module or a chip packaging module) by aligning each interconnection structure of the chip/module with a corresponding bonding pad of the module/chip. The superconducting chip and the module may then be brought close together (for example, depending on the orientation, the superconducting chip may be lowered towards the module, or the module may be raised towards the superconducting chip) until each superconducting solder bump comes into contact with a respective one of the superconducting bonding pads. Once the superconducting chip and the module are in physical contact with each other heat may be applied to reflow the solder bumps and form structural and superconductively electrical connections between the chip and module. This process of applying heat to a testing or chip packaging assembly to melt/reflow solder bumps in order to attach a superconducting chip to a testing module or a chip packaging module is referred to as a "solder reflow process." Thus, throughout this specification and the appended claims, the term "solder reflow" is used to describe the process of melting/reflowing solder bumps. The same, or a similar, process may be used to physically and superconductively decouple the chip form the module, for example, in decoupling the superconducting chip from a testing module prior to coupling the superconducting chip to a chip packaging module.

The temperature at which the superconducting chip and the superconducting signal paths start to superconduct is based on the superconducting materials in the superconducting chip and the superconducting signal paths. Throughout this specification and the appended claims, the temperature at which a superconducting material may start to superconduct is referred to as the "critical temperature" of the material. In order for the superconducting chip and the signal paths to superconduct/become superconductive, the testing assembly (for example, testing assembly 500 of FIG. 5) or chip packaging assembly (for example, chip packaging assembly 700 of FIG. 7) should be cooled to the lowest critical temperature of the critical temperatures of each of the superconducting materials in the superconducting chip and the signal paths so that effective superconducting signal transfer through the superconducting signal paths to and from the superconducting chip can be achieved.

Throughout this specification and the appended claims, the terms "superconducting" and "superconductive" when used to describe a physical structure such as a "superconducting trace", "superconductive layer", "pillar/layer of superconducting/superconductive material" or "superconductive interconnection structure" are used to indicate a material that is capable of behaving as a superconductor at an appropriate temperature. A superconducting material may not necessarily be acting as a superconductor at all times in all embodiments of the present systems and devices.

A superconducting solder bump may be a ball of superconducting solder. A superconducting solder bump may comprise curved edges forming a semi-sphere comprising a height and a radius when formed on a layer of superconducting/adhesion material. Therefore, throughout this specification and the appended claims, the terms "solder bump", "superconducting solder bump", or "a bump of superconductive solder" are used to describe a volume of superconducting solder comprising superconducting material(s) such as tin, lead and the like or a combination thereof, formed on a layer of superconducting material with a rough shape of a semi-sphere where the roughly flat end of the semi-sphere is in contact with the layer of superconducting material.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems and methods of superconducting circuits, not necessarily the exemplary methods for quantum computation generally described above.

The various embodiments described above can be combined to provide further embodiments. All of the US patents, US patent application publications, US patent applications, foreign patents, foreign patent applications and non-patent publications referred to in this specification and/or listed in the Application Data Sheet, including but not limited to: U.S. Provisional Patent Application Ser. No. 61/738,246, U.S. Pat. No. 7,135,701, U.S. Pat. No. 7,418,283, U.S. Provisional Patent Application Ser. No. 60/872,414, U.S. Provisional Patent Application Ser. No. 60/886,253, US Patent Application Publication No. 2006-0225165, and US Patent Application Publication No. 2006-0147154 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of testing and packaging a superconducting chip, wherein the superconducting chip includes at least one material that superconducts below a critical temperature, the method comprising:
   forming a first set of superconducting solder bumps on the superconducting chip;
   superconductively electrically coupling the superconducting chip to a testing module via the first set of superconducting solder bumps to form a testing assembly;
   cooling the testing assembly to a first temperature below the critical temperature such that the superconducting chip superconducts;
   testing electrical properties of the superconducting chip while the superconducting chip superconducts;
   removing the superconducting chip from the testing assembly, wherein removing the superconducting chip from the testing assembly includes decoupling the superconducting chip from the testing module via the first set of superconducting solder bumps;
   forming a second set of superconducting solder bumps on a chip packaging module; and
   after removing the superconducting chip from the testing assembly, superconductively electrically coupling the superconducting chip to the chip packaging module via the second set of superconducting solder bumps.

2. The method of claim 1 wherein the testing module comprises a first set of superconducting bonding pads, each superconducting bonding pad in the first set of superconducting bonding pads including at least one layer of superconducting material, and wherein superconductively electrically coupling the superconducting chip to the testing module via the first set of superconducting solder bumps includes superconductively electrically coupling the superconducting chip to the first set of superconducting bonding pads via the first set of superconducting solder bumps.

3. The method of claim 2 wherein superconductively electrically coupling the superconducting chip to the testing module via the first set of superconducting solder bumps includes positioning the superconducting chip in physical contact with the testing module such that each superconducting solder bump in the first set of superconducting solder bumps aligns with and forms a superconductive electrical connection to a respective superconducting bonding pad in the first set of superconducting bonding pads.

4. The method of claim 2 wherein the superconducting chip comprises a second set of superconducting bonding pads, each superconducting bonding pad in the second set of superconducting bonding pads including at least one layer of superconducting material, and wherein superconductively electrically coupling the superconducting chip to the chip packaging module via the second set of superconducting solder bumps includes superconductively electrically coupling the superconducting chip to the second set of superconducting bonding pads via the second set of superconducting solder bumps.

5. The method of claim 4 wherein superconductively electrically coupling the superconducting chip to the chip packaging module via the second set of superconducting solder bumps includes positioning the superconducting chip in physical contact with the chip packaging module such that each superconducting solder bump in the second set of superconducting solder bumps aligns with and forms a superconductive electrical connection to a respective superconducting bonding pad in the second set of superconducting bonding pads.

6. The method of claim 1 wherein the superconducting chip comprises a superconducting quantum processor.

7. The method of claim 1 wherein the testing module is a multi-chip module.

8. The method of claim 1 wherein superconductively electrically coupling the superconducting chip to the testing module via the first set of superconducting solder bumps includes superconductively electrically coupling the superconducting chip to the testing module via a solder reflow process.

9. The method of claim 1 wherein superconductively electrically coupling the superconducting chip to the chip packaging module via the second set of superconducting solder bumps includes superconductively electrically coupling the superconducting chip to the chip packaging module via a solder reflow process.

10. The method of claim 1, further comprising:
cooling the chip packaging module to a second temperature below the critical temperature such that the superconducting chip superconducts.

11. The method of claim 10 wherein the second temperature is lower than the first temperature.

12. The method of claim 1 wherein:
superconductively electrically coupling the superconducting chip to the testing module via the first set of superconducting solder bumps includes forming a first set of continuous, uninterrupted superconducting signal paths between the superconducting chip and the testing module; and
superconductively electrically coupling the superconducting chip to the chip packaging module via the second set of superconducting solder bumps includes forming a second set of continuous, uninterrupted superconducting signal paths between the superconducting chip and the chip packaging module.

13. A method of testing and packaging a superconducting chip, wherein the superconducting chip includes at least one material that superconducts below a critical temperature, the method comprising:
forming a first set of superconducting solder bumps on a testing module;
superconductively electrically coupling the superconducting chip to the testing module via the first set of superconducting solder bumps to form a testing assembly;
cooling the testing assembly to a first temperature below the critical temperature such that the superconducting chip superconducts;
testing electrical properties of the superconducting chip while the superconducting chip superconducts;
removing the superconducting chip from the testing assembly, wherein removing the superconducting chip from the testing assembly includes decoupling the superconducting chip from the testing module via the first set of superconducting solder bumps;
forming a second set of superconducting solder bumps on a chip packaging module; and
after removing the superconducting chip from the testing assembly, superconductively electrically coupling the superconducting chip to the chip packaging module via the second set of superconducting solder bumps.

14. The method of claim 13 wherein the superconducting chip comprises a first set of superconducting bonding pads, each superconducting bonding pad in the first set of superconducting bonding pads including at least one layer of superconducting material, and wherein superconductively electrically coupling the superconducting chip to the testing module via the first set of superconducting solder bumps includes superconductively electrically coupling the testing module to the first set of superconducting bonding pads via the first set of superconducting solder bumps.

15. The method of claim 14 wherein superconductively electrically coupling the superconducting chip to the testing module via the first set of superconducting solder bumps includes positioning the superconducting chip in physical contact with the testing module such that each superconducting solder bump in the first set of superconducting solder bumps aligns with and forms a superconductive electrical connection to a respective superconducting bonding pad in the first set of superconducting bonding pads.

16. The method of claim 14 wherein superconductively electrically coupling the superconducting chip to the chip packaging module via the second set of superconducting solder bumps includes superconductively electrically coupling the chip packaging module to the first set of superconducting bonding pads via the second set of superconducting solder bumps.

17. The method of claim 16 wherein superconductively electrically coupling the superconducting chip to the chip packaging module via the second set of superconducting solder bumps includes positioning the superconducting chip in physical contact with the chip packaging module such that each superconducting solder bump in the second set of superconducting solder bumps aligns with and forms a superconductive electrical connection to a respective superconducting bonding pad in the first set of superconducting bonding pads.

18. The method of claim 13 wherein the superconducting chip comprises a superconducting quantum processor.

19. The method of claim 13 wherein the testing module is a multi-chip module.

20. The method of claim 13 wherein superconductively electrically coupling the superconducting chip to the testing module via the first set of superconducting solder bumps includes superconductively electrically coupling the superconducting chip to the testing module via a solder reflow process.

21. The method of claim 13 wherein superconductively electrically coupling the superconducting chip to the chip packaging module via the second set of superconducting solder bumps includes superconductively electrically coupling the superconducting chip to the chip packaging module via a solder reflow process.

22. The method of claim 13, further comprising:
cooling the chip packaging module to a second temperature below the critical temperature such that the superconducting chip superconducts.

23. The method of claim 22 wherein the second temperature is lower than the first temperature.

24. The method of claim 13 wherein:
- superconductively electrically coupling the superconducting chip to the testing module via the first set of superconducting solder bumps includes forming a first set of continuous, uninterrupted superconducting signal paths between the superconducting chip and the testing module; and
- superconductively electrically coupling the superconducting chip to the chip packaging module via the second set of superconducting solder bumps includes forming a second set of continuous, uninterrupted superconducting signal paths between the superconducting chip and the chip packaging module.

25. A method of forming a superconductive interconnection structure, the method comprising:
- depositing a superconductive bonding pad;
- depositing a pillar of under-bump metal ("UBM") on a portion of the superconductive bonding pad;
- depositing a bump of superconductive solder on the pillar of UBM; and
- depositing a layer of superconductive material over the pillar of UBM and a portion of the superconductive bonding pad not covered by the pillar of UBM such that the layer of superconductive material is interposed between the pillar of UBM, a portion of the superconductive bonding pad not covered by the pillar of UBM, and the bump of superconductive solder;
- wherein the portion of the superconductive bonding pad on which the UBM is deposited is less than the entirety of a surface of the superconductive bonding pad; and
- wherein depositing a layer of superconductive material over the pillar of UBM and a portion of the superconductive bonding pad not covered by the pillar of UBM includes depositing a layer of tin over the pillar of UBM and a portion of the superconductive bonding pad not covered by the pillar of UBM.

26. The method of claim 25 wherein depositing a pillar of UBM on the portion of the superconductive bonding pad comprises depositing a pillar of superconductive UBM on at least a portion of the superconductive bonding pad.

27. The method of claim 26 wherein depositing a pillar of superconductive UBM includes depositing a pillar of at least one superconductive material selected from the group consisting of: osmium, rhenium, ruthenium, and a combination thereof.

28. The method of claim 25 wherein depositing a pillar of UBM includes depositing a pillar of at least one material selected from the group consisting of: copper and gold.

* * * * *